United States Patent
Yamashita et al.

[11] Patent Number: 5,281,865
[45] Date of Patent: Jan. 25, 1994

[54] FLIP-FLOP CIRCUIT

[75] Inventors: Hiroki Yamashita, Hachioji; Hiroyuki Itoh, Akigawa; Hirotoshi Tanaka, Kokubunji; Atsumi Kawata, Hachioji; Kenji Nagai, Iruma; Kazuhiro Yoshihara, Ome; Ichiro Imaizumi, Tokyo, all of Japan

[73] Assignee: Hitachi, Ltd., Tokyo, Japan

[21] Appl. No.: 797,922

[22] Filed: Nov. 26, 1991

[30] Foreign Application Priority Data

Nov. 28, 1990 [JP] Japan ................ 2-322974
Sep. 2, 1991 [JP] Japan ................ 3-248216
Sep. 21, 1991 [JP] Japan ................ 3-270272

[51] Int. Cl.⁵ .............. H03K 17/16; H03K 3/289
[52] U.S. Cl. .................. 307/279; 307/473; 307/272.1; 307/272.2; 307/289; 307/291
[58] Field of Search ... 307/448, 450, 473, 272.1–272.2, 307/279, 289, 291

[56] References Cited

U.S. PATENT DOCUMENTS

| | | | |
|---|---|---|---|
| 4,063,225 | 12/1977 | Stewart | 307/473 |
| 4,980,577 | 12/1990 | Baxter | 307/291 |
| 4,992,677 | 2/1991 | Ishibashi et al. | 365/230.06 |
| 5,043,944 | 8/1991 | Nakamura et al. | 307/473 |
| 5,057,711 | 10/1991 | Lee et al. | 307/473 |

FOREIGN PATENT DOCUMENTS 0152330 11/1981 Japan ................ 307/473

Primary Examiner—Margaret R. Wambach
Attorney, Agent, or Firm—Antonelli, Terry, Stout & Kraus

[57] ABSTRACT

A flip-flop circuit receives a pair of complementary data signals, then outputs complementary signals corresponding to the pair of complementary data signals. The pair of data signals are also supplied to a driving gate means which outputs a signal corresponding to at least one data signal of the pair of data signals supplied thereto. The driving gate means also comprises at least one try-state gate controlled by a clock signal. An output signal of the driving gate means is held by a memory means, and also outputted as complementary output signals.

30 Claims, 18 Drawing Sheets

| INPUT | | | OUTPUT | |
|---|---|---|---|---|
| DT | DB | CKB | QT | QB |
| X | X | H | HIGH IMPEDANCE (OUTPUT OPEN STATE) | HIGH IMPEDANCE (OUTPUT OPEN STATE) |
| L | H | L | L | H |
| H | L | L | H | L |

| INPUT | | | OUTPUT |
|---|---|---|---|
| DT | DB | CK | QB |
| — | — | H | HIGH IMPEDANCE |
| L | H | L | H |
| H | L | L | L |

FLIP-FLOP CIRCUIT

BACKGROUND OF THE INVENTION

The present invention relates to a semiconductor memory circuit, particularly to a flip-flop circuit suitable for logic circuits in high speed operation.

In conventional flip-flop circuits using a high speed GaAs semiconductor device, for example, there has been a device described in IEEE GaAs IC Symposium (1988) pp. 27-30. FIG. 20 shows a flip-flop circuit diagram on the basis of the GaAs semiconductor device described in the above-mentioned thesis. Hereinafter, a filed-effect transistor is referred to as "FET" for the sake of simplicity.

The flip-flop circuit shown in FIG. 20 comprises transfer FETs 2001 and 2002, inverters 2003 and 2004 for holding data, and inverters 2005 and 2006 for buffering. In the flip-flop circuit shown in FIG. 20, when a clock signal CKT is turned to the Low level, the transfer FETs 2001 and 2002 become the cut-off state irrelevant to levels of data signals DT and DB. Because of this, potentials of terminals 2007 and 2008 are held by the inverters 2003 and 2004, unchanging thereof. That is, when the clock signal CKT is turned to the Low level, the flip-flop circuit holds information. Also, turning the clock signal CKT to the High level turns the transfer FETs 2001 and 2002 On to determine the potentials of the terminals 2007 and 2008 of the inverters 2003 and 2004 in response to the data signals DT and DB, respectively, so that information of the flip-flop circuit is rewritten. For example, when the data signal DT is the Low level while the data signal DB is the High level, the potential of the terminal 2007 is brought down to each threshold voltage of the inverters 2003 and 2004 by the transfer FET 2001. When the potential of the terminal 2007 goes down beyond each threshold voltage of the inverters 2003 and 2004, the potential of the terminal 2007 is more decreased by the inverter 2004 to turn to the Low level. Conversely, the potential of the terminal 2008 is brought up to each threshold voltage of the inverters 2003 and 2004 by the transfer FET 2002. When the potential of the terminal 2008 goes up beyond each threshold voltage of the inverters 2003 and 2004 by the transfer FET 2002, the potential of the terminal 2008 is more increased by the inverter 2003 to turn to the high level. At this time, both inverted logical levels of the terminals 2007 and 2008 are outputted from output signals QT and QB by the inverters 2005 and 2006, respectively.

At a trailing edge of the inverted clock signal CKB, a flip-flop circuit receives the data signal DT and transfers a signal to a succeeding stage. Such flip-flop circuit is known as an edge trigger type flip-flop circuit as shown in FIG. 21. Such an edge trigger type flip-flop circuit is also disclosed on "Design and Application MOS/LSI" published by Electronics Digest Co., November 20, 1977, pp. 122-126.

SUMMARY OF THE INVENTION

In the flip-flop circuit shown in FIG. 20, a delay time from when switching the clock signal CKT up to when switching the output signals QT and QB becomes the sum of a time required for inverting outputs of the inverters 2003 and 2004 and a delay time caused by the inverters 200 and 2006 for buffering. The time required for inverting the outputs is determined by a load driving current flowing in the transfer FETs 2001 and 2002 and the inverters 2003 and 2004, and a capacity of a load connected to output terminals. While the delay time caused by the inverters 2005 and 2006 is determined by a load driving current flowing in inverters 2003 and 2004, and a capacity of the load connected to the output terminals. In the flip-flop circuit shown in FIG. 20, the delay time from when switching the clock signal CKT up to when switching the output signals QT and QB cannot be shortened to equal or less than the delay time required for the two-stage inverters depending on the FET capacity comprised of the inverters, even though a wiring capacity makes small in contrast to the load capacity. Also, in the case of making small FET capacity as a load capacity by a small FET size, the load driving current of the FET is also become smaller in the same time, so that the above delay time cannot be shortened.

Furthermore, in the edge trigger type flip-flop circuit as shown in FIG. 21, from the trailing edge of an inverted clock signal CKB up to reliably setting each logical level of output signals QT and QB, the signal must be passed through either three-stage NOR gates 2103, 2106 and 2105 or three-stage NOR gates 2102, 2105 and 2106, generating a delay time caused by the three stage of the NOR gates. Assuming that a level variation of a data signal DT makes match with the trailing edge of the inverted clock signal CKB, the delay time caused by the two-stage NOR gates 2004 and 2003 must be considered as maximum number of the stages, so that a set-up time of the edge trigger type flip-flop circuit becomes longer. Because of this, the high speed operation of the edge trigger type flip-flop circuit including the delay time in the NOR gates is limited, so that a cycle time of a high speed IC apparatus using the flip-flop circuits is limited.

Accordingly, it is an object of the present invention to provide a flip-flop circuit capable of operating in high speed, by shortening a delay time from when switching a clock signal up to when switching an output signal.

It is another object of the present invention to provide an edge trigger type flip-flop circuit capable of shortening a transfer delay time and a set-up time.

In order to achieve the above objects, in an aspect of embodiments, a flip-flop circuit comprises a driving gate block including a try-state gate controlled by a clock signal, and a memory block for holding an output voltage of the driving gate block. Also, the output impedance of the memory block is set sufficiently in small in comparison with the output impedance of the driving gate block when applying the clock signal.

Applying the clock signal to the driving gate block forcibly outputs an output voltage corresponding to a logical level of the data signal. On the other hand, not applying the clock signal to the driving gate block becomes the high impedance about the output impedance thereof, irrelevant to the data signal. At this time, the output of the driving gate block is held a voltage thereof, the voltage being of the clock signal applied by the memory block. So, the driving gate block drives the load and serves to rewrite information of the memory block. The memory block serves to hold the output voltage or information when the clock signal is not applied. According to the embodiment of the present invention, a delay time from when switching the clock signal up to when switching output signal is similar to a delay time caused by the single-stage try state gate, enabling high speed operation.

In another aspect of the embodiments, an edge trigger type flip flop circuit comprises two flip-flop circuits described above which are dependently connected one to another, each of the flip-flop circuits being operated by the alternate clock signal.

As a result, the edge trigger type flip-flop circuit of the embodiment can shorten the transfer delay time and set-up time to the delay time caused by the single-stage try-state gate, enabling high speed logical operation.

DETAILED DESCRIPTION OF THE PREFERRED EMBODIMENT

Figures 1A, 1B:
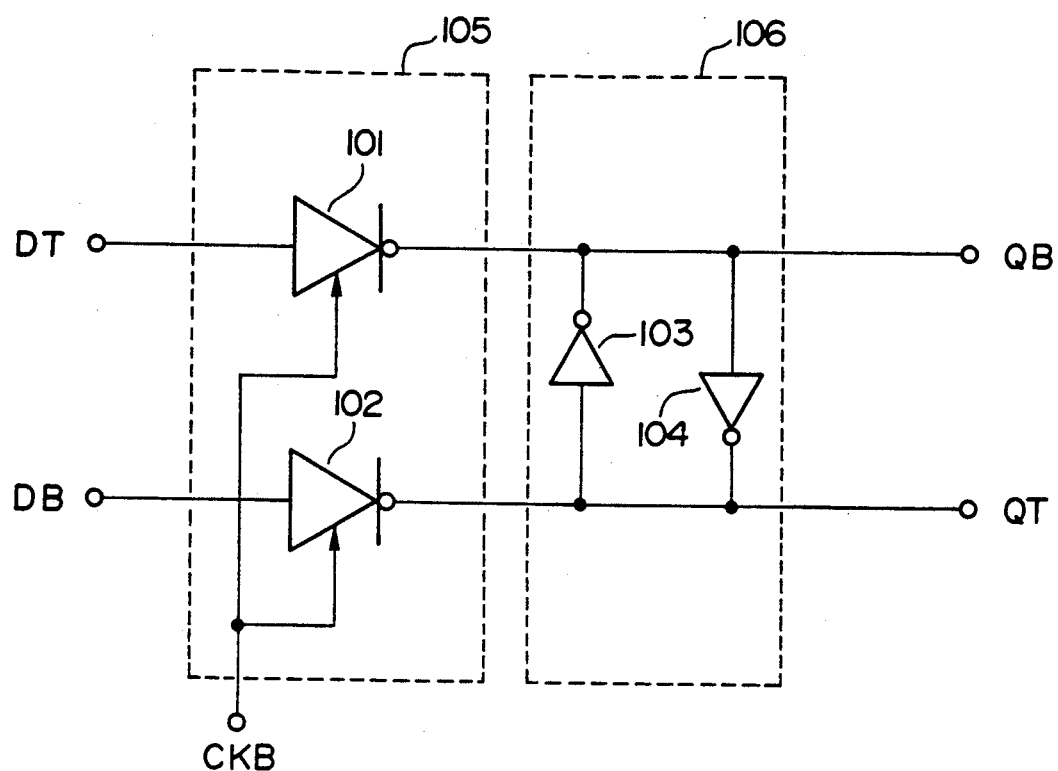
FIG. 1A is a circuit diagram showing a flip-flop circuit of an embodiment.
FIG. 1B is a truth table for for a try-state gate shown in FIG. 1A.

Hereinafter, embodiments of the present invention are described with reference to the drawings. FIG. 1A shows a flip-flop circuit comprised of a driving gate block 105 for outputting output signals QB and QT corresponding to data signals DT and DB when a clock signal CKB is the Low level, and a memory block 106 for holding each logic level of the output signals Q and QB. The driving gate block 105 comprises two try-state gates 101 and 102 controlled by the clock signal CKB. The memory block 106 comprises two inverters 103 and 104, both the output impedances of which are set sufficiently in small in comparison with each output impedance of the try-state gates 101 and 102.

The try-state gates 101 and 102 serves as inverters irrelevant to each output level of the inverters 103 and 104 when clock signal CKB is the Low level as shown in FIG. 1B, and outputs the inverted output signals QB and QT with respect to the inputted data signals DT and DB, respectively. On the other hand, when the clock signal CKB is turned to the High level, each output of the try-state gates 101 and 102 becomes the high impedance irrelevant to the signal levels of the data signals DT and DB to thereby become the open state at the output thereof. At this time, the output signals QT and QB are held each output level of the try-state gates 101 and 102, each output level of which is a previous state of the clock signal CKB switched by the inverters 103 and 104 in the memory block 106.

Accordingly, when the clock signal CKB is turned to the Low level, the try-state gates 101 and 102 rewrites information in the memory block 106 (or taking in data), at the same time, outputs the inverted output signals QB and QT of the data signals DT and DB, respectively. In addition, when the clock signal CKB is turned to the High level from the level in present, each logical level of the output signals QB and QT is held unchanged by the memory block 106. So, a time period from when the clock signal CKB up to when switching the output signals QT and QB, is determined by a delay time caused by the try-state gates 101 and 102, a delay time caused by the flip-flop circuit is also determined by a delay time caused by the single-stage inverter 103 or 104 for buffering.

Figure 2:
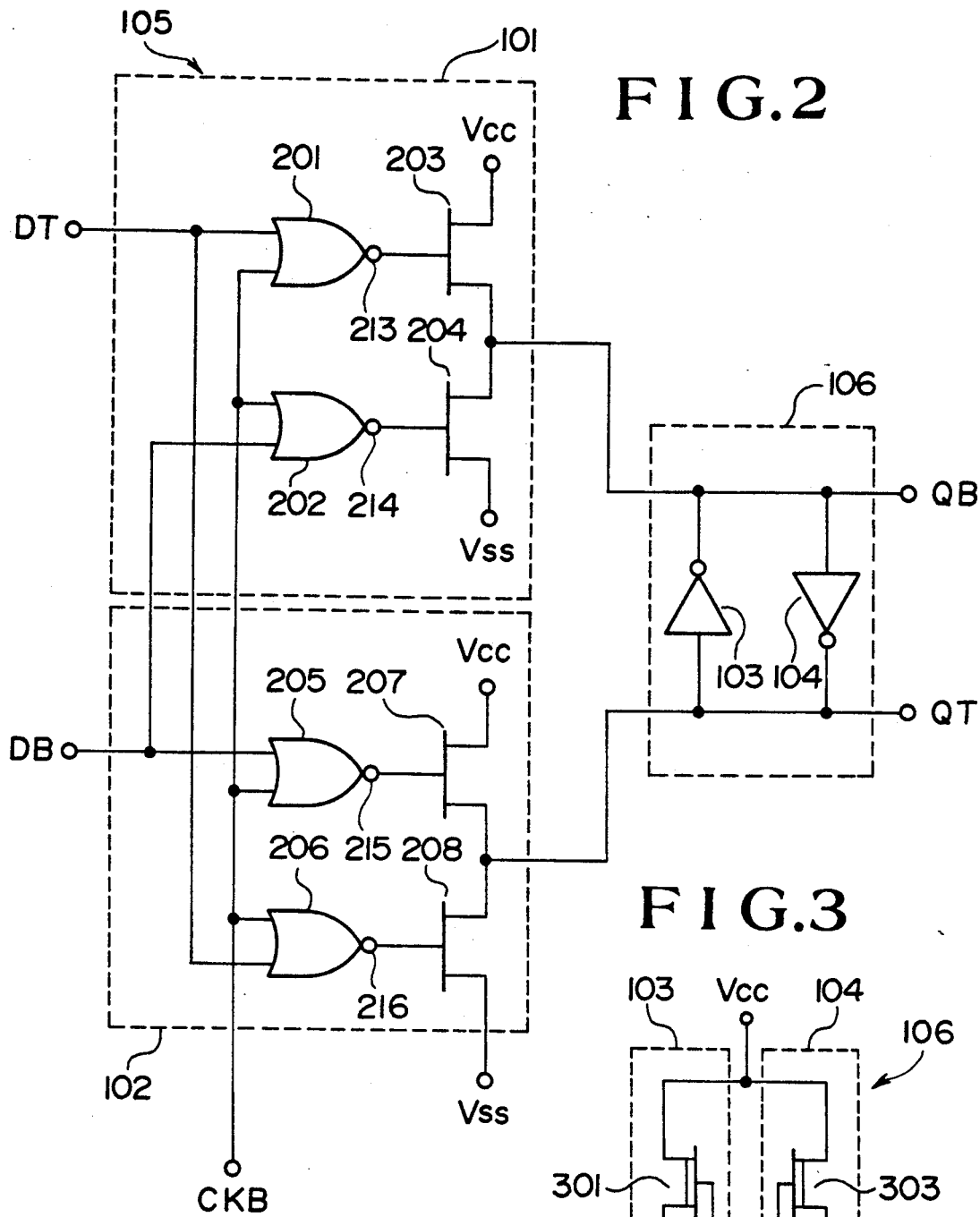
FIG. 2 is a circuit diagram showing a driving gate block.

FIG. 2 shows another flip-flop circuit, the driving gate block 105 of which is comprised of NOR gates 201, 202, 205 and 206, and normally-off type FETs 203, 204, 207 and 208, instead of the driving gate block 105 shown in FIG. 1A.

In FIG. 2, a try-state gate 101 comprises: the NOR gates 201 and 202; and the normally-off type FETs 203 and 204. While a try-state gate 102 comprises: the NOR gates 205 and 206; and the normally-off type FETs 207 and 208. A Vcc is a positive source voltage terminal and a Vss is a negative source voltage terminal. For example, 1 volt of the positive voltage is applied to the positive source voltage terminal Vcc and 0 volt of the negative voltage as the ground voltage is applied to the negative source voltage terminal Vss.

Since the try-state gate 101 is identical with the try-state gate 102 about the circuit construction and operation, the try-state gate 101 is only described in the embodiment for the sake of simplicity.

It describes first about when a clock signal CKB is the Low level. When the data signal DT is the High level and the data signal DB is the Low level, a signal of the Low level (approximately 0 volt) which is an inverted signal of the data signal DT, is generated at an output node 213 of the NOR gate 201, and a signal of the High level (approximately 1 volt) which is an inverted signal of the data signal DB, is generated at an output terminal 214 of the NOR gate 202. As a result, the normally-off type FET 203 is turned Off and the normally-off type FET 204 turning On, so that an output signal QB is brought down to the negative source voltage Vss to thereby turn to the Low level (approximately 0 volt). On the other hand, when the data signal DT is the Low level and the data signal DB is the High level, the output node 213 of the NOR gate 201 is turned to the High level (approximately 1 volt) and the output node 214 of the NOR gate 202 turning to the Low level (approximately 0 volt). At this time, the normally-off type FET 204 is turned Off and the normally-off type FET 203 turning On, so that the output signal QB is brought nearly down to the positive source voltage (Vcc) to thereby turn to the High level (approximately 1 volt).

It describes next about when the clock signal CKB is the High level. In the case of above state, both the logical levels of the output nodes 213 and 214 of the NOR gates 201 and 202 are the Low level, irrelevant to the states of the data signals DT and DB, so that both the normally-off type FETs 203 and 204 are turned Off. So, the output of the try-state gate 101 becomes the open state, that is, the output impedance becomes high. Accordingly, the try-state gate is comprised of the NOR gates and the normally-off type FETs, and also the flip-flop circuit can be achieved by the circuit construction as shown in FIG. 2, which has the same function as the flip-flop circuit shown in FIG. 1.

In the description of the specification, the flip-flop circuit comprised of FETs is described as example, however, it is possible to comprise the flip-flop circuit comprised of bipolar transistors and the like instead of the FET. Description of the the memory block 106 is omitted because of the same construction and reference numerals thereof shown in FIG. 1A.

Figure 3:
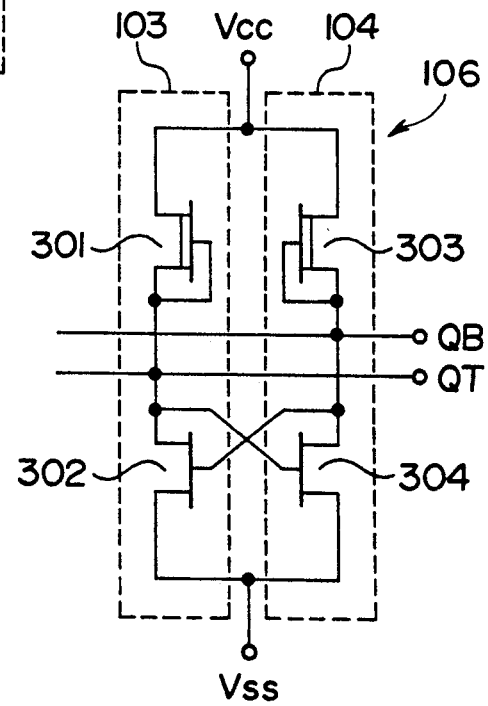
FIG. 3 is a circuit diagram showing a memory block of the flip-flop circuit.

FIG. 3 shows detailed circuit diagram of the memory block 106 shown in FIG. 1A. In FIG. 3, the inverter 103 comprises a normally-on type FET 301 and a normally-off type FET 302, and the inverter 104 comprising a normally-on type FET 303 and a normally-off type FET 304. A Vcc is a positive source voltage terminal and a Vss is a negative source voltage terminal to which, for example, 1 volt is applied, and 0 volt is applied, respectively. Also, both threshold voltages of the normally-off type FETs 302 and 304 are set to 0.1 volt, respectively.

Each gate of the normally-on type FETs 301 and 303 is commonly connected to each of the sources thereof, these common connections are connected to output terminals (QB) and (QT), respectively. Each gate of the normally-off type FETs 302 and 304 is connected to each output of the opposite inverters 103 and 104, that is, also connected to the output terminals (QB) and (QT), respectively.

According to the above circuit construction, when the output signal QT of the inverter 103 is the High level (approximately 1 volt), the voltage of the High level is applied to the gate of the normally-off type FET 304. Because of this, the normally-off type FET 304 is turned On, so that the voltage of the output signal QB of the inverter 104 is brought nearly down to the negative source voltage (Vss), turning to the Low level. Also, because of applying the voltage (the Low level) of the output signal QB to the gate of the normally-off type FET 302, the normally-off type FET 302 is turned Off. As a result, the voltage of the output signal QT is brought up to the positive source voltage (Vcc) by the normally-on type FET 301, turning to the High level. In the above states, the voltage of the output signal QT of the inverter 103 is held with the High level and the voltage of the output signal QB of the inverter 104 being held with the Low level.

Accordingly, by forcibly setting the output signals QT and QB to the High or Low level, each voltage of the output signals QT and QB is converted into each level, so that information held in the inverters 103 and 4 can be rewritten. At this time, each High level voltage of the output signals QT and QB is brought nearly up to the positive source voltage (Vcc), but the voltage is determined by the Schottkey diode voltage-current characteristics in the forward-bias direction between the gate and source of the normally-off type FETs 302 and 304, clamping approximately 0.7 to 1 volt.

Figure 4:
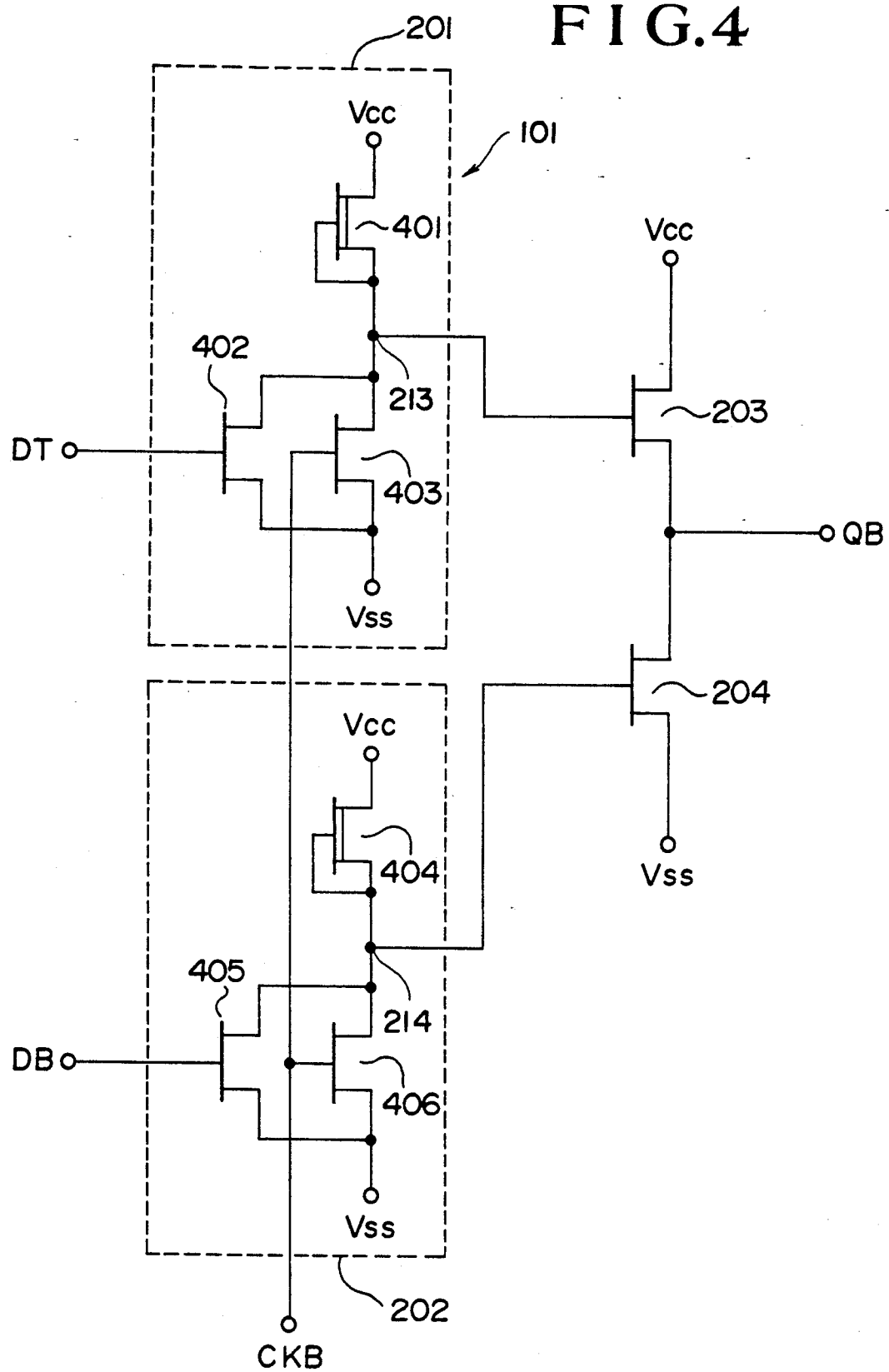
FIG. 4 is a circuit diagram showing a try-state gate for use in the flip-flop circuit.

FIG. 4 shows a try-state gate comprised of FETs instead of the NOR gates 201 and 202 of the try-state gate 101 shown in FIG. 2.

In FIG. 4, a NOR gate 201 comprises normally-off type FETs 402 and 403 connected in parallel for driving a load means, and a normally-on type FET 401 connected commonly with a gate and source thereof to operate the load means. Similarly, a NOR gate 202 comprises a normally-on type FET 404 connected commonly with a gate and source thereof as the load means, and normally-off type FETs 405 and 406 connected in parallel for driving the load means. A Vcc is a positive source voltage terminal and a Vss is a negative source voltage terminal, for example, the positive source voltage is 1 volt and the negative source voltage is 0 volt. Each threshold voltage of the normally-off type FETs 402, 403, 405 and 406 is set to 0.1 volt, respectively.

According to the above circuit construction, when the clock signal CKB is the High level (approximately 1 volt), both the normally-off type FET 403 of the NOR gate 201 and the normally-off type FET 406 of the NOR gate 202 are turned On, irrelevant to each logical level of the data signals DT and DB. Because of this, each potential of the output nodes 213 and 214 of the respective NOR gates 201 and 202 is brought nearly down to the negative source voltage (Vss), turning to the Low level (approximately 0 volt). As a result, both the normally-off type FETs 203 and 204 are turned Off, so the output terminal (QB) becoming the open state or the high impedance. On the other hand, when the clock signal CKB is the Low level (approximately 0 volt), because of turning the normally-off type FETs 403 and 406 Off, each output level of the output nodes 213 and 214 of the NOR gates 201 and 202 is determined by each logical level of the data signals DT and DB. For example, when the data signal DB is the High level (approximately 1 volt) and the data signal DT is the Low level (approximately 1 volt), the normally-off type FET 402 is turned Off, so the potential of the output node 213 of the NOR gate 201 is brought nearly up to the positive source voltage (Vcc) by the normally-on type FET 401, turning to the High level (approximately 1 volt). Also, because of turning the normally-off type FET 402 On, the potential of the output node 214 of the NOR gate 202 is brought nearly down to the negative source voltage (Vss) of the NOR gate 202, turning to the Low level (approximately 0 volt). As a result, the normally-off type FET 203 is turned On and the normally-off type FET 204 being turned Off, so that the voltage of the output signal QB is brought nearly up to the positive source voltage (Vcc) by the normally-off type FET 401, turning to the High level (approximately 1 volt). The same function as the try-state gate 101 shown in FIG. 2 can be achieved according to the circuit construction as shown in FIG. 4, similarly the try-state gate 102 can also be achieved.

Figure 5:
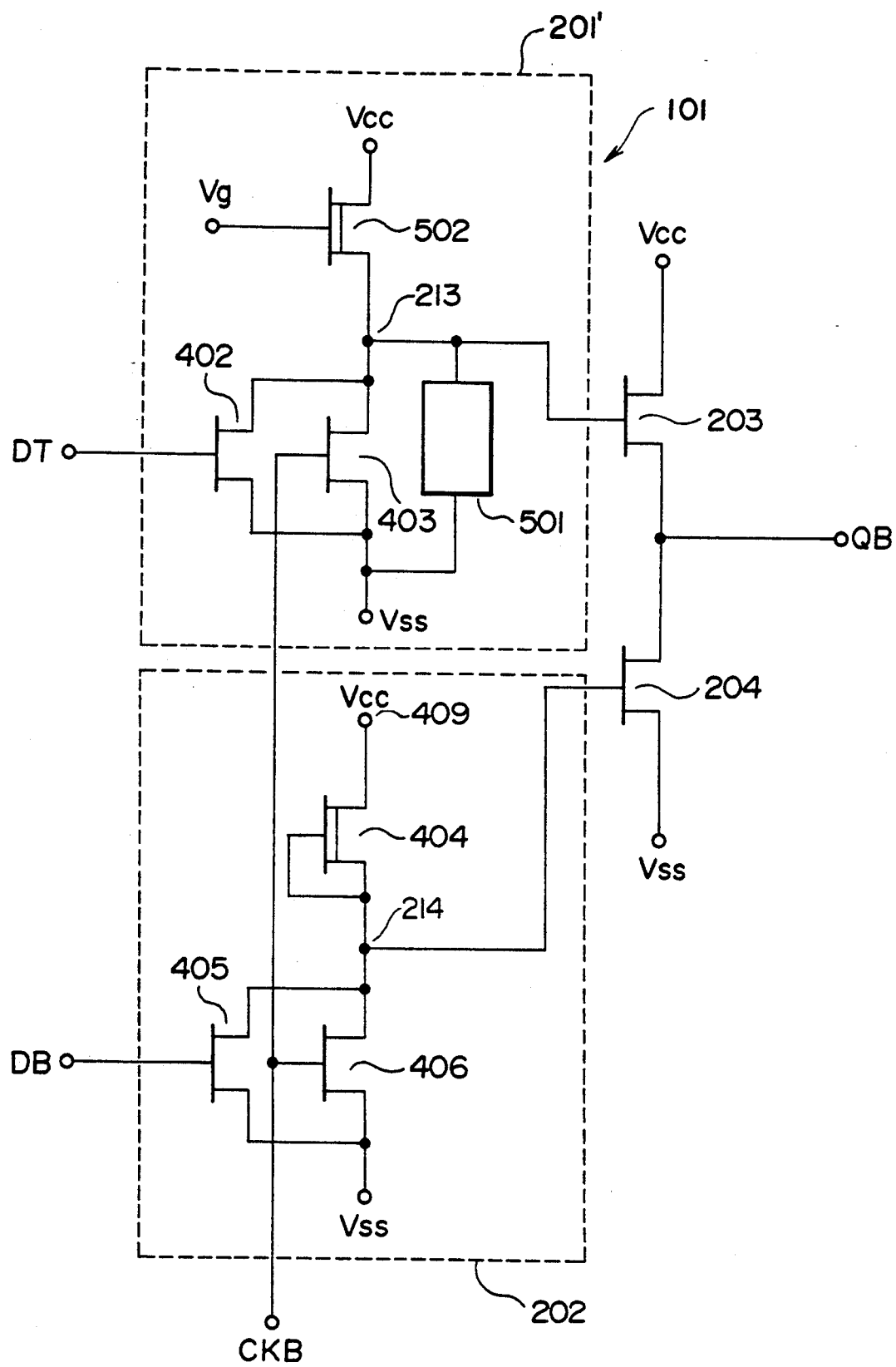
FIG. 5 is a circuit diagram showing another try-state gate for use in the flip-flop circuit.
Figure 6A:
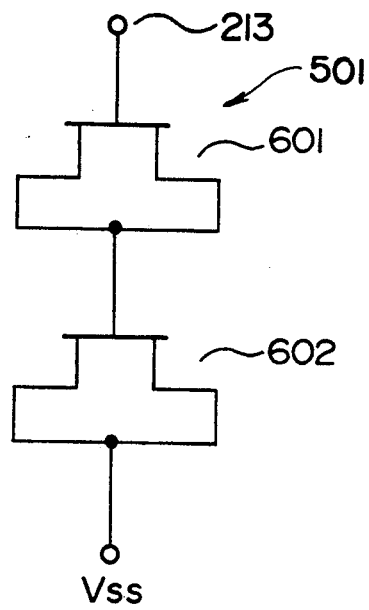
FIG. 6A to FIG. 6D are circuit diagrams showing clamp means shown in FIG. 5.
Figure 6B:
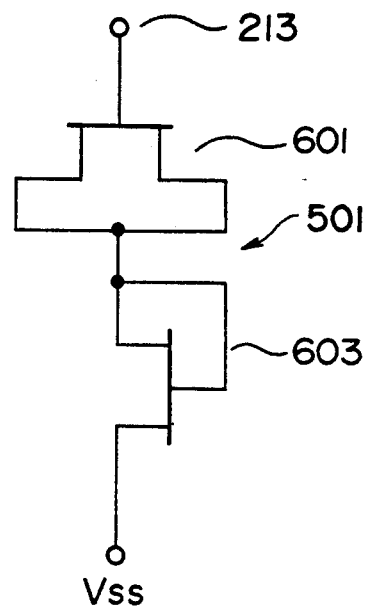
Figure 6C:
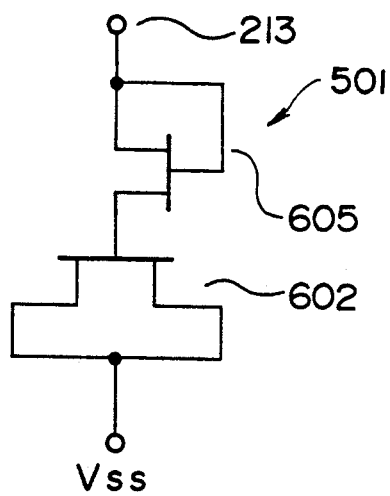
Figure 6D:
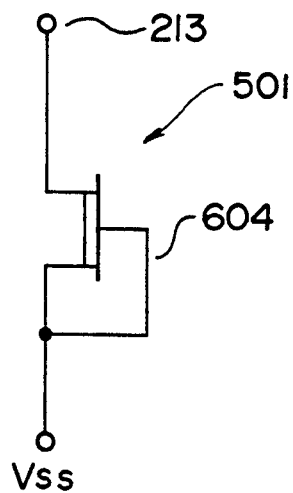

FIG. 5 shows a circuit construction of another try-state gate 101. In FIG. 5, a NOR gate 201' includes a normally-on type FET 502 applied a fixed voltage Vg to a gate thereof as a gate voltage in place of the normally-on type FET 401 of the NOR gate 201 shown in FIG. 4, and also includes a clamp circuit 501 connected between an output node 213 and the negative source voltage terminal Vss. So, adjusting the gate voltage Vg of the normally on type FET 502 controls a current flowing into normally-off type FETs 402 and 403 when both FETs 402 and 403 are On state. The normally-on type FET 502 serves as a load means of the normally-off type gates 402 and 403 similar to the normally-on type FET 401 as shown in FIG. 4. In both the try-state gates 201', 202, when the clock signal CKB is the High level, the normally-off type FETs 403 and 406 are turned On, so that each output of the NOR gates 201' and 202 is turned to the Low level. Because of this, the normally-off type FETs 203 and 204 are turned Off, thereby not flowing the current into the normally-off type FETs 203 and 204.

In the case that the clock signal CKB is the Low level, when a data signal DT is the High level and a data signal DB is the Low level, the voltage of the output node 213 of the NOR gate 201' is turned to the Low level and an output node 214 of the NOR gate 202 turning to the High level. As a result, the normally-off type FET 203 is turned Off and the normally-off type FET 204 turning On, so that the current is flown into the normally-off type FET 204 from the memory block 106 connected to an output terminal (QB) of the try-state gate 101. An amperage of the current is determined by the normally-on type FET 303 (FIG. 3) of the memory block 106, and is not influenced by variation of the positive source voltage (Vcc) and the negative source voltage (Vss). On the other hand, when the data signal DT is the Low level and the data signal DB is the High level, the voltage of the output node 213 of the NOR gate 201' is turned to the High level and the voltage of the output node 214 of the NOR gate 202 turning to the Low level, so the normally-off type FET 204 is turned Off and the normally-off type FET 203 turning On, so that a current is flown into the memory block 106 connected to the output terminal (QB) from the normally-off type FET 203. Because the amperage of the current is determined by the voltage between a gate and source of the normally-off type FET 203, when the voltage of the output node 213 of the NOR gate 201' is changed, the amperage of the current of the NOR gate 201' is also changed. However, because the clamp circuit 501 is included in the NOR gate 201', the High level of the output node 213 of the NOR gate 201' is clamped with a certain level, so the High level is not changed, even though the positive source voltage (Vcc) is changed, suppressing the variation of the output current from the normally-off type FET 203. Accordingly, in the embodiment, it is possible to achieve the try-state gate 101 which has the function of suppressing the variation against the output current supplied to the memory block 106. Remainder of description such as the normally-off type FET 405 and the normally-on type FET 404 is omitted because of similar to these of FIG. 4, which has already described previously.

FIG. 6A to FIG. 6D show various types of the clamp circuits. The clamp circuit 501 comprises normally-off type FETs 601 and 602 connected in series in FIG. 6A, that is, each of the source and drain thereof is connected commonly and the common connection of the normally-off type FET 601 is also connected to a gate of the normally-off type FET 602. The output node 213 and the negative source voltage terminal Vss correspond to FIG. 5. The clamp circuit 501 comprises normally-off type FETs 601 and 603 connected in series in FIG. 6B, that is, the source and drain of the normally-off type FET 601 are commonly connected, and the common connection is also connected to another common connection between a gate and drain of the normally-off type FET 603. The clamp circuit 501 comprises normally-off type FETs 605 and 602 connected in series in FIG. 6C, that is, a gate and drain of the normally-off type FET 605 are connected in common and a source of the normally-off type FET 605 is connected to the gate of the normally-off type FET 602, the source and drain of which are connected in common. The clamp circuit 501 comprises a normally-on type FET 604, a gate and source of which are connected in common in FIG. 6D.

Figure 7:
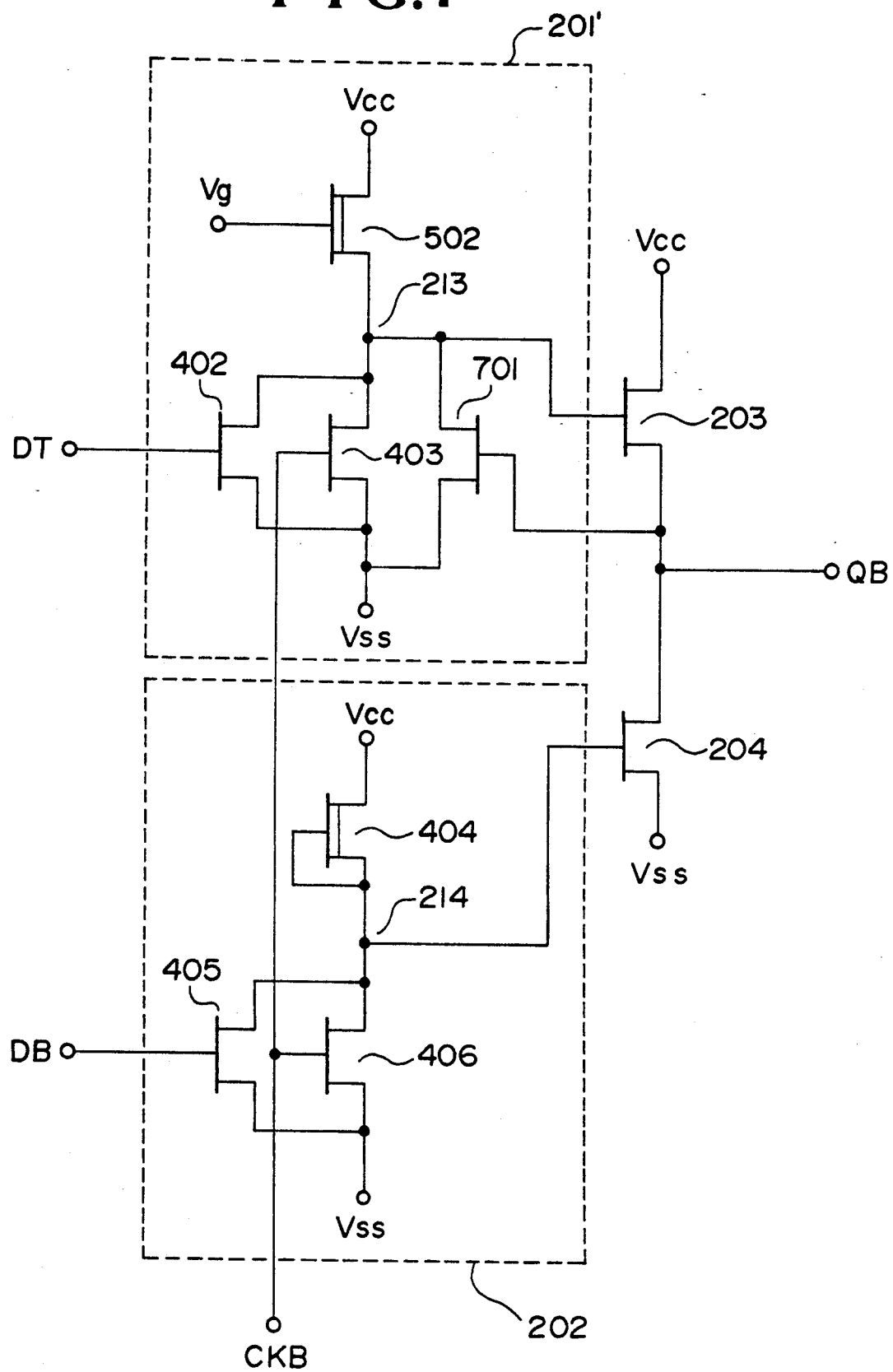
FIG. 7 is a circuit diagram showing still another try-state gate for use in the flip-flop circuit.

FIG. 7 shows another flip-flop circuit having another type clamp circuit 701. In FIG. 7, the clamp circuit comprises a normally-off type FET 701, a drain of which is connected to the output node 213 of the NOR gate 201', a source of which is connected to the negative source voltage (Vss), and a gate of which is connected to the output terminal (QB). The normally-off type FET 701 is turned On when the output signal QB is the High level, clamping the voltage of the output terminal 213 of the NOR gate 201' in the High level. Accordingly, the embodiment shown in FIG. 7 can also obtain the advantage similar to the embodiment shown in FIG. 5. The try-state gate described above can be applicable for not only the element or device of the flip-flop circuit, but also wide variety of applications such as a bus driver and the like. Remainder of description is omitted by designating the same reference numerals, which is already described previously.

Figures 8A, 8B:
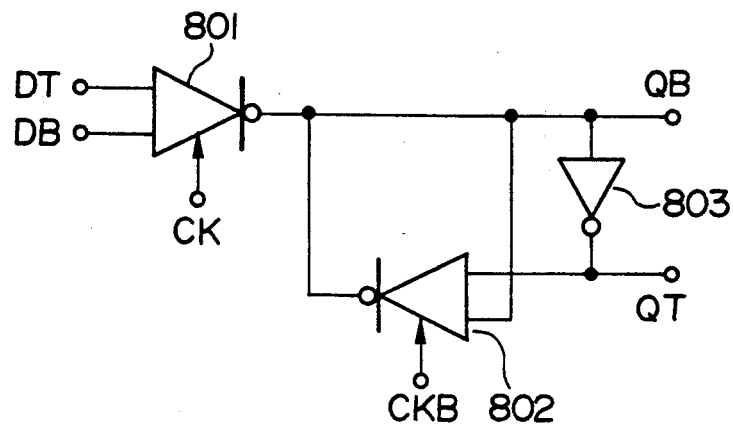
FIG. 8A is a circuit diagram showing a flip-flop circuit of another embodiment.
FIG. 8B is a truth table for the flip-flop circuit shown in FIG. 8A.

FIG. 8A shows a basic logical circuit of another flip-flop circuit related to the present invention. In FIG. 8A, for example, the flip-flop circuit is included a high speed integrated circuit basically comprised of normally-off type and normally-on type FETs. The circuit includes other elements which are not shown in FIG. 8A, these are formed on a semiconductor substrate such as a compound semiconductor of GaAs (gallium-arsenic).

In FIG. 8A, the flip-flop circuit comprises: a try-state gate 801 as a driving gate block for outputting an output signal QB, phase of which is identical with a data signal DB with respect to the complementary data signals DT and DB, when a non-inverted clock signal CK is the Low level; a try-state gate 802 as a memory block for holding the voltage of the output signal QB, when an inverted clock signal CKB is the Low level; and inverter 803 for generating another input signal of the try-state gate 802 from the output signal QB.

FIG. 8B shows a truth table of the try-state gate 801. That is, the output signal QB of the try-state gate 801 becomes an identical phase with the data signal DB when the non-inverted clock signal CK is the Low level, and the output thereof becomes the high impedance or the open state when the non-inverted clock signal CK is the High level. Similarly, a truth table of the try-state gate 802 is identical with that of the try-state gate 801. The output signal QB of the try-state gate 802 becomes an identical phase with the signal QB inputted into the inverter 803 when the inverted clock signal CKB is the Low level, holding the voltage of the output signal QB. Also, the output of the try-state gate 802 becomes the high impedance or the open state.

As a result, because the non-inverted clock signal CK is related with the inverted clock signal CKB in complementary, when the non-inverted clock signal CK is the Low level, the output of the try-state gate 802 becomes the high impedance or the open state, so that the try-state gate 801 drives a load to thereby switch the output voltage or information. By turning the non-inverted clock signal CK to the High level, then the inverted clock signal CKB to the Low level, the output of the try-state gate 802 is held in the output voltage of the try-state gate 801, the output voltage being of a potential which is a previous level prior to turning the non-inverted clock signal CK, so that the output of the try-state gate 801 becomes the high impedance o the open state. Because of this, the voltage of the output signal QB of the flip-flop circuit is irrelevant to the data signals DT and DB when operating the flip-flop circuit.

Accordingly, a delay time from when switching the non-inverted clock signal CK up to when outputting data, is determined by a delay caused by the try-state gate 801, and the delay time becomes a time required for transferring the signal in the single-stage of the gate. As a result, the high speed performance is maintained and one inverter can be reduced from the flip-flop circuit shown in FIG. 1A. In addition, because the output of the try-state gate 802 is held in the output voltage of the try-state gate 801, and nothing else required for it, the large output impedance can be obtained therebetween, so that transistor size can be reduced, and power consumption can also be reduced.

Figure 9A:
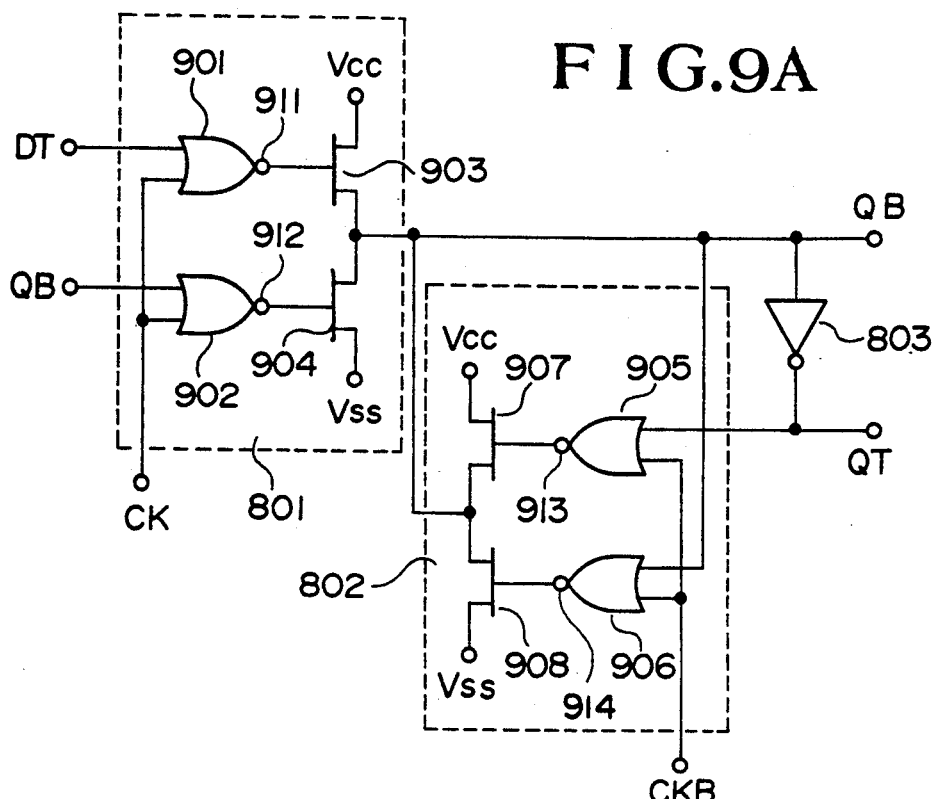
FIG. 9A is a detailed circuit diagram for the flip-flop circuit shown in FIG. 8A.

FIG. 9A shows the detailed try-state gates 801 and 802, both of which are diagrammatically shown in FIG. 8A. In FIG. 9A, the try-state gate 801 comprises NOR gates 901 and 902, and normally-off type FETs 903 and 904. Also, the try-state gate 802 comprises NOR gates 905 and 906, and normally-off type FETs 907 and 908. A Vcc is a positive source voltage terminal to which, for example, 0 volt such as ground voltage being applied. A Vss is a negative source voltage terminal to which −1 volt such as a negative voltage is applied.

Figure 9B:
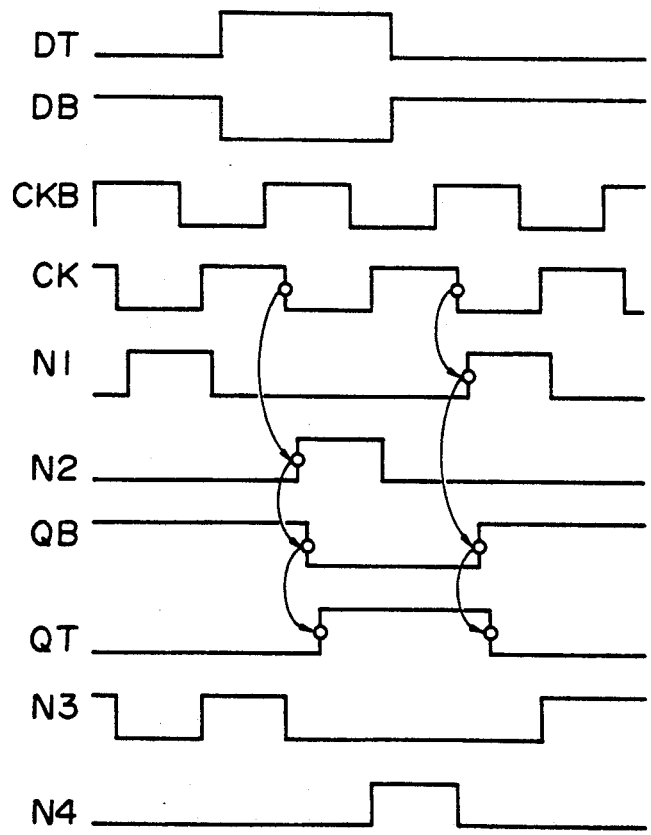
FIG. 9B is a time chart for the flip-flop circuit shown in FIG. 9A.

FIG. 9B shows a time chart of the flip-flop circuit shown in FIG. 9A.

The operation of the try-state gate 801 is explained next. When the non-inverted clock signal CK is the Low level, the data signal DT is the High level, and the complementary data signal DB is the Low level, the Low level of the inverted data signal DT is generated at an output node 911 of the NOR gate 901, and the High level is generated at an output node 912 of the NOR gate 902. As a result, because the normally-off type FET 903 is turned Off and the normally-off type FET 904 is turned On, an output signal QB is brought down to the negative source voltage (Vss), turning to the Low level.

On the other hand, when the non-inverted clock signal CK is the Low level, the data signal DT is the Low level, and the data signal DB is the High level, the output node 911 of the NOR gate 901 is turned to the High level and the output node 912 of the NOR gate 902 is tuned to the Low level, then the normally-off type FET 903 is turned On and the normally-off type FET 904 is turned Off, so that the output signal QB is brought nearly up to the positive source voltage (Vcc), turning to the High level.

When the non-inverted clock signal CK is the High level, because each voltage of the output nodes 911 and 912 of the NOR gates 901 and 902 is turned to the Low level, respectively, both the normally-off type FETs 903 and 904 are turned Off. As a result, the output of the try-state gate 801 becomes the open state, that is, the output impedance becoming high.

The operation of the try-state gate 802 is explained next. When the non-inverted clock signal CK is the Low level or the inverted clock signal CKB being the High level, because each voltage of the output nodes 913 and 914 of the NOR gates 905 and 906 is turned to the Low level, respectively, both the normally-off type FETs 907 and 908 are turned Off, so that the output of the try-state gate 802 becomes the open state, that is, the output impedance becoming high.

When an inverted clock signal CKB is the Low level, the output signal QB is the High level, because an output signal QT of the inverter 803 is turned to the Low level, the High level which is the inverted signal of the output signal QT of the inverter 803, is generated at the output node 913 of the NOR gate 905, and the Low level which is the inverted signal of the input signal QB, is generated at the output node 914 of the NOR gate 906. As a result, because the normally-off type FET 907 is turned On and the normally-off type FET 908 is turned Off, the output signal QB is held in the High level.

On the other hand, when the inverted clock signal CKB is the Low level and the output signal QB is the Low level, because the output signal QT of the inverter 803 is turned to the High level, the output node 913 of the NOR gate 905 is turned to the Low level and the output terminal 914 of the NOR gate 906 is turned to the High level, then the normally-off type FET 907 is turned Off and the normally-off type FET 908 is turned On, so that the output signal QB is held in the Low level.

The flip-flop circuit shown in FIG. 9A can be achieved in accordance with the above description. In FIG. 9B of a time chart, the phase of the non-inverted clock signal CK is opposite to that of the inverted clock signal CKB. In the case that the output of the try-state gate 802 does not become the high impedance when the try-state gate 801 is being taken data in, the try-state gate 802 may hold the output voltage thereof. So, if the output impedance of the try-state gate 802 is set in large, the try-state gate 801 drives a load thereby to be able to rewrite information of the output signal QB. Accordingly, the operation can be achieved as described above.

Figure 10:
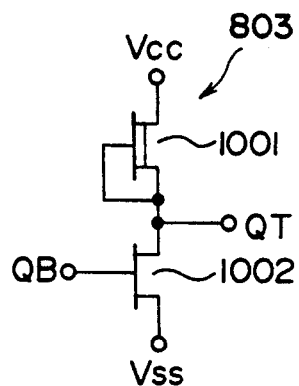
FIG. 10 is a circuit diagram showing an inverter for use in the flip-flop circuit shown in FIG. 8.

FIG. 10 shows an example of the inverter 803 for use in the flip-flop circuit shown in FIG. 8A. In FIG. 10, the inverter 803 comprises a normally-on type FET 1001 including a connection in common between a gate and source thereof, and a normally-off type FET 1002 including a connection between the output terminal (QB) and a drain thereof, the output terminal (QT) being connected to the common connection of the normally-on type FET 1001, and a gate of the normally-off type FET 1002 being connected to the output terminal (QB) of the try-state gate 801. A Vcc is a positive source voltage terminal and a Vss is a negative source voltage terminal. Accordingly, when the output signal QB of the inverter 803 is the High level, the normally-off type FET 1002 is turned On, so that the voltage of the output signal QT of the inverter 803 is brought nearly down to the negative source voltage (Vss), turning the to Low level. Also, the voltage of the output signal QB of the inverter 803 is the Low level, the normally-off type FET 1002 is turned Off, so that the voltage of the output signal QT of the inverter 803 is brought nearly up to the negative source voltage (Vcc) by the normally-on type FET 1001, turning to the High level. According to the above description, the inverter 803 can be achieved from the circuit construction shown in FIG. 10.

Figure 11A:
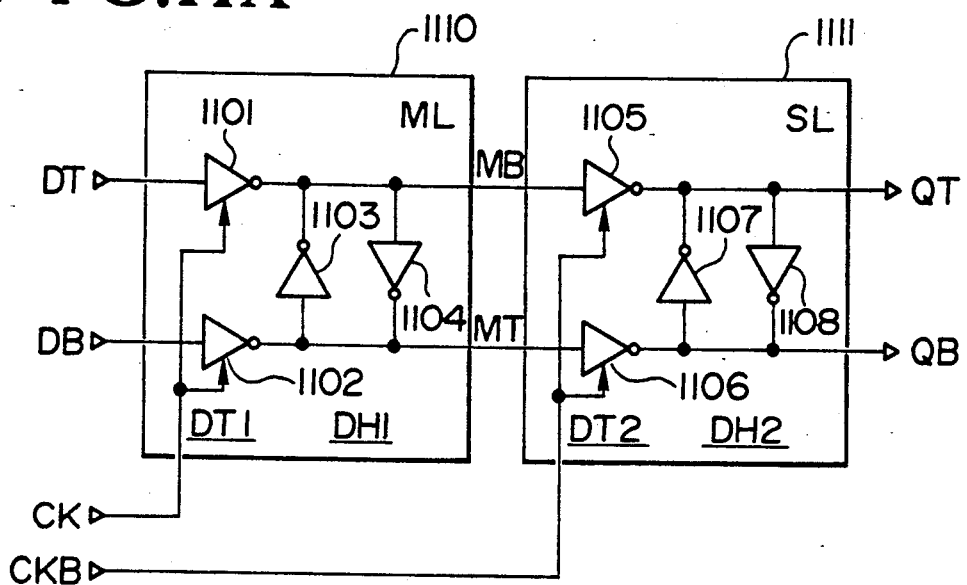
FIG. 11A is a circuit diagram showing an edge trigger type flip-flop circuit of an embodiment.
Figure 11B:
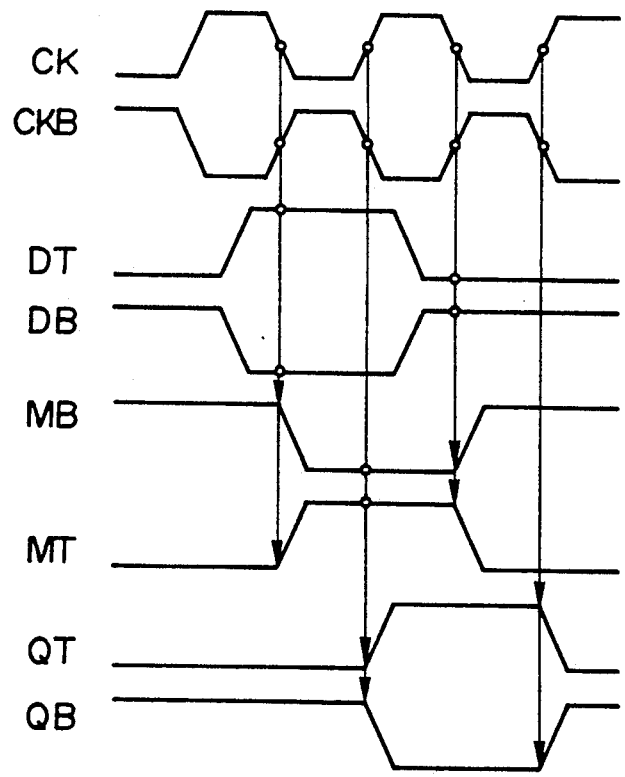
FIG. 11B is a time chart for the edge trigger type flip-flop circuit shown in FIG. 11A.

FIG. 11A shows an edge trigger type flip-flop circuit comprised of two flip-flop circuits shown in FIG. 1A, one flip-flop circuit being dependently connected to the other. In FIG. 11A, the edge trigger type flip-flop circuit comprises: a master latch 1110 for selectively taking in and holding complementary data or a non-inverted data signal DT and an inverted data signal DB depending on a non-inverted clock signal CK; and a slave latch 1111 for selectively taking in and transferring the complementary output data from the master latch 1110 or an inverted output signal MB and a non-inverted output signal MT in response to an inverted signal of the non-inverted clock signal CK or the inverted clock signal CKB. Both the non-inverted output signal QT and the inverted output signal QB of the slave latch 1111 are transferred to a succeeding stage circuit (not shown in the drawing), from as the edge trigger type flip-flop circuit. It is noted that the non-inverted clock signal CK is digital signal which is altered the High and Low levels in predetermined period, and the inverted clock signal CKB is complementary signal of the non-inverted clock signal CK as shown in FIG. 11B, and also, the non-inverted data signal DT and the inverted data signal DB are predetermined digital signals for selectively turning the logical level prior to level change of the non-inverted clock signal CK or the inverted clock signal CKB.

The master latch 1110 comprises: a driving gate block DT1 including a pair of a try-state gates 1101 and 1102, input nodes of which receive the non-inverted data signal DT or the inverted data signal DB, and control nodes of which commonly receive the non-inverted clock signal CK; and a memory block DH1 including a pair of inverters 1103 and 1104, each of the input and output terminals of which is oppositely connected each other. On the other hand, the slave latch 1111 comprises: a driving gate block DT2 including a pair of try-state gates 1105 and 1106, input terminals of which receive the inverted output signal MB or the non-inverted output signal MT from the master latch 1110, and control nodes of which commonly receive the inverted clock signal CKB; and a memory block DH2 including a pair of inverters 1107 and 1108, each of the input and output terminals of which is oppositely connected each other.

The driving gate blocks DT1 and DT2 of the respective master latch 1110 and slave latch 1111 can be achieved from the circuit construction shown in FIG. 2, and also, the memory blocks DH1 and DH2 can be achieved from the circuit construction shown in FIG. 3.

According to the description previously, the normally-on type FETs 301, 303 and the normally-off type FETs 302, 304 shown in FIG. 3 comprising the inverters 1103, 1104, 1107 and 1108 of the memory blocks DH1 and DH2, are formed with sufficiently small size in comparison with that of the normally-off type FETs 203, 204, 207 and 208 shown in FIG. 2 comprising the try-state gates 1101, 1102, 1105 and 1106 of the driving gate blocks DT1 and DT2. Because of this, each of the inverters 1103, 1104, 1107 and 1108 shown in FIG. 11A has small driving performance in comparison with the try-state gates 1101, 1102, 1105 and 1106, so that holding data in the memory blocks DH1 and DH2 are forcibly rewritten by the corresponding driving gate blocks DT1 and DT2.

According to the edge trigger type flip-flop circuit in the embodiment, at the trailing edge of the non-inverted clock signal CK or the leading edge of the inverted clock signal CKB shown in FIG. 11B, both the non-inverted output signal MT and the inverted output signal MB of the master latch 1110, are changed by logical levels of the non-inverted data signal DT and the inverted data signal DB, respectively. The logical levels of the non-inverted output signal MT and the inverted output signal MB of the master latch 1110 are taken in the slave latch 1111 at the leading edge of the non-inverted clock signal CK or the trailing edge of the inverted clock signal CKB, so that these logical levels become the non-inverted output signal QT and the inverted output signal QB of the edge trigger type flip-flop circuit, respectively. That is, both the non-inverted data signal DT and the inverted data signal DB are taken in the master latch 1110 at the trailing edge of the non-inverted clock signal CK or the leading edge of the inverted clock signal CKB in the edge trigger type flip-flop circuit, then also taken in the slave latch 1111 at the leading edge of the non-inverted clock signal CK or the trailing edge of the inverted clock signal CKB, so that both the non-inverted data signal DT and the inverted data signal DB become the non-inverted output signal QT and the inverted output signal QB of the edge trigger type flip-flop circuit.

At this time, a time from the leading edge of the non-inverted clock signal CK or the trailing edge of the inverted clock signal CKB up to when changing the logical levels of the non-inverted output signal QT and the inverted output signal QB of the edge trigger type flip-flop circuit, is determined by only a transfer delay time caused by the single-stage try-state gate 1105 or 1106, so that the transfer delay time of the edge trigger type flip-flop circuit becomes extremely small. Also, a time required for taking the non-inverted data signal DT and the inverted data signal DB in the edge trigger type flip-flop circuit or the master latch 1110, is determined by only the transfer delay time caused by the single-stage of the try-state gate 1101 or 1102 comprising the master latch 1110, so that a set-up time of the edge trigger type flip-flop circuit becomes extremely small. As a result, the edge trigger type flip-flop circuit in the embodiment operates in high speed, and also, the cycle time of a high speed logic integrated circuit including plural edge trigger type flip-flop circuits can be shortened in the embodiment.

Figure 12:
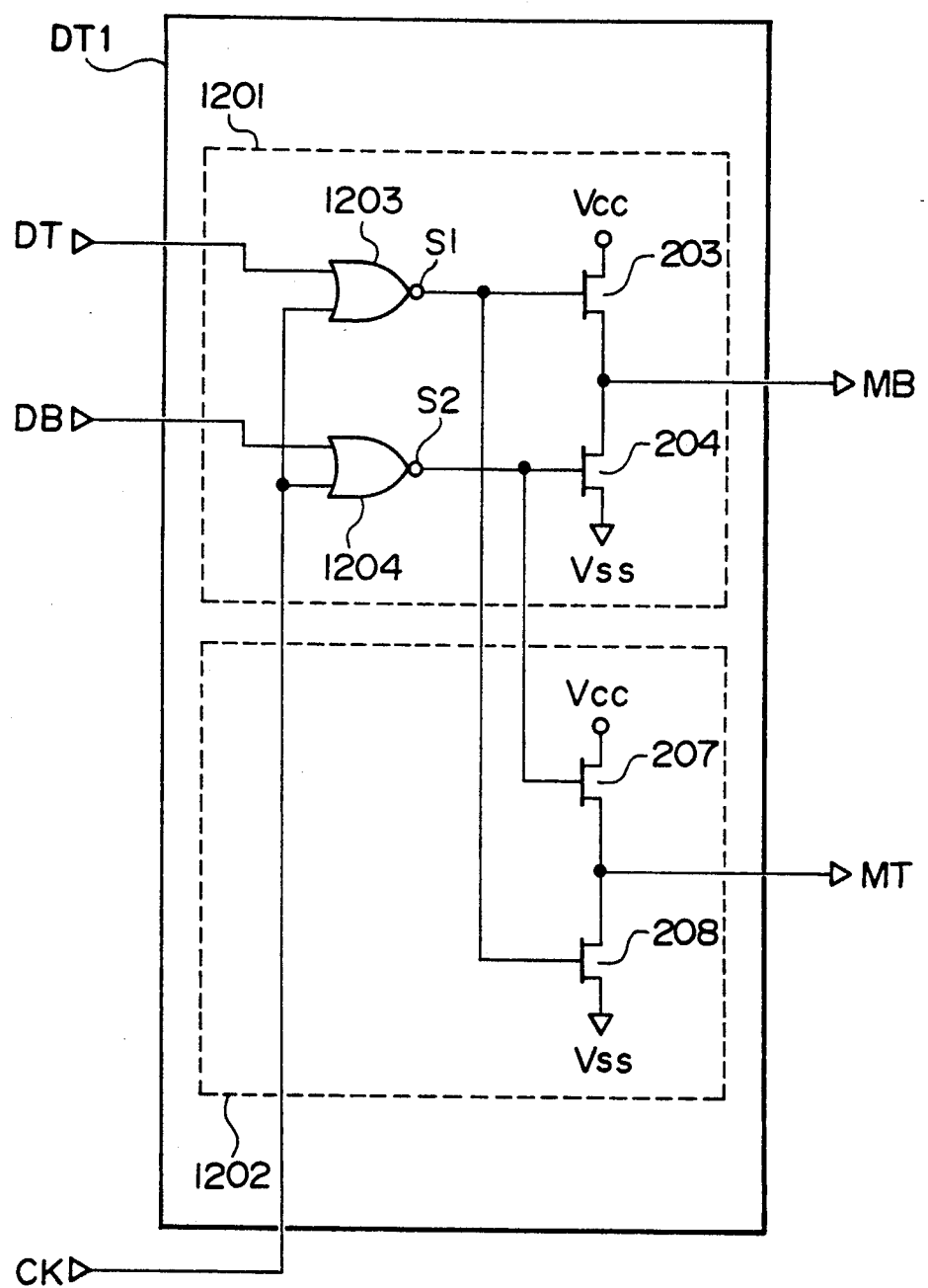
FIG. 12 is a circuit diagram showing a driving gate block of the edge trigger type flip-flop circuit shown in FIG. 11A.

FIG. 12 shows another type of the driving gate block DT1 incorporated in the master latch 1110 of the edge trigger type flip-flop circuit shown in FIG. 11A. It is noted that the driving gate block DT1 is also applicable for the driving gate block DT2 included in the slave latch 1111 shown in FIG. 11A. In FIG. 12, the NOR gates 1203, 1204 and the normally-off type FETs 203, 204, 207 and 208 correspond to the NOR gates 201, 202 shown in FIG. 4 and the normally-off type FETs 203, 204, 207 and 208 shown in FIG. 2, respectively. The driving gate block DT1 is explained hereinafter.

In FIG. 12, the driving gate block DT1 comprises that the try-state gate 1202 is similar to the try-state gate 102 of the driving gate block shown in FIG. 2. The try-state gate 1202 does not include NOR gates corresponding to the NOR gates 205 and 206 shown in FIG. 2, but includes a pair of the normally-off type FETs 207 and 208 connected to the positive source voltage (Vcc) and the negative source voltage (Vss) with totem pole shaped, in which a gate of the normally-off type FET 207 is connected to an output node S2 of the NOR gate 1204, and a gate of the normally-off type FET 208 is connected to an output node S1 of the NOR gate 1203. As is apparent from the description of FIG. 2, each logical state of the NOR gates 207 and 208 corresponds to the logical states of the NOR gates 203 and 204 in a try-state gate 1201, respectively. Because of this, the try-state gate 1202 shown in FIG. 12 has the same function as the try-state gate 102 in FIG. 2, enabling the circuit construction to simplicity as the driving gate block DT1.

Figure 13A:
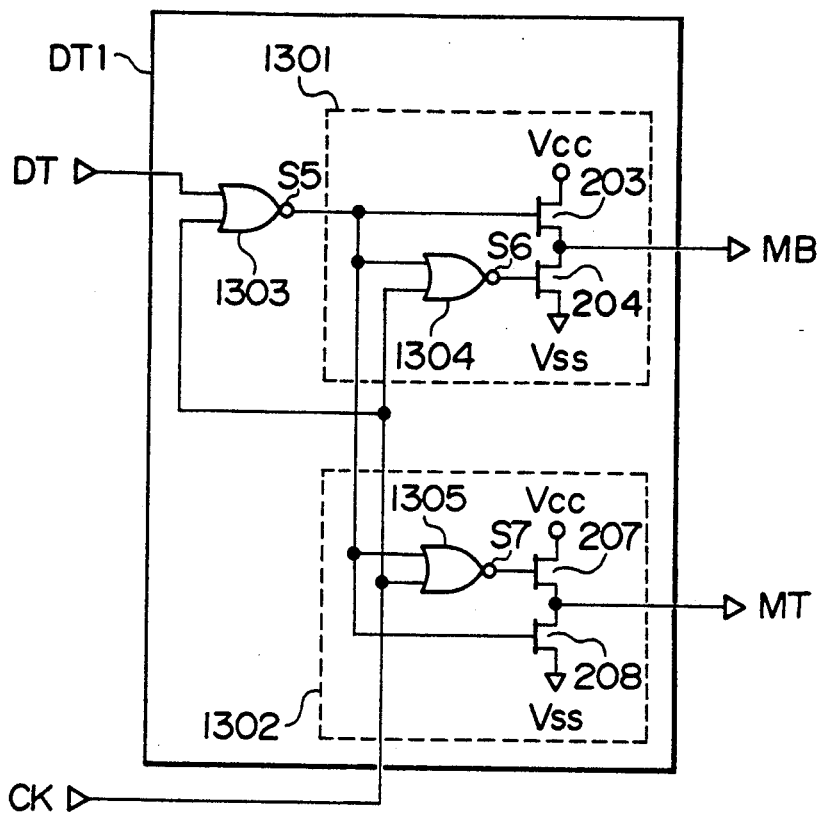
FIG. 13A is a circuit diagram showing another driving gate block of the edge trigger type flip-flop circuit shown in FIG. 11A.
Figure 13B:
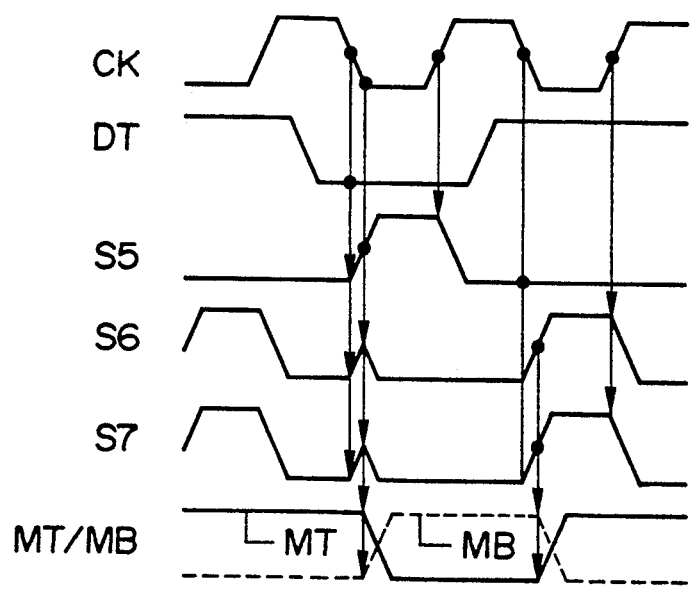
FIG. 13B is a time chart for the driving gate block shown in FIG. 13A.

FIG. 13A shows an example of another driving gate block DT1 incorporated in the master latch 1110 of the edge trigger flip-flop circuit shown in FIG. 11A, and FIG. 13B shows a time chart of signals. It is noted that the normally-off type FETs 203, 204, 207 and 208 shown in FIG. 13A correspond to the normally-off type FETs 203, 204, 207 and 208 shown in FIG. 2 and FIG. 12.

In FIG. 13A, the driving gate block DT1 includes a pair of try-state gates 1301 and 1302, control nodes of which commonly receive a non-inverted clock signal CK. The try-state gates 1301 and 1302 includes a pair of the normally-off type FETs 203, 204 and another pair of 207, 208, each pair of which is connected to the positive source voltage (Vcc) and the negative source voltage (Vss), respectively, with totem pole shaped, in which a gate of the normally-off type FET 203 in the try-state gate 1301 and a gate of the normally-off type FET 208 in the try-state gate 1302, are commonly connected to an output node S5 of the NOR gate 1303. Also, a gate of the normally-off type FET 204 in the try-state gate 1301 is connected to an output node S6 of the NOR gate 1304, and a gate of the normally-off type FET 207 in the try-state gate 1302 is connected to an output node S7 of the NOR gate 1305. Each of one input node of the NOR gates 1304 and 1305 is commonly connected to the output node S5 of the NOR gate 1303 to receive an output signal, and the other input nodes of the NOR gates 1304 and 1305 commonly receive the non-inverted clock signal CK. Also, one input node of the NOR gate 1303 receives a non-inverted data signal DT, the other input node thereof receives the non-inverted clock signal CK.

Accordingly, when the non-inverted clock signal CK is the High level, the signal levels at the output nodes S5, S6 and S7 of the respective NOR gates 1303, 1304 and 1305 are turned to the Low level as shown in FIG. 13B, respectively. Because of this, the normally-off type FETs 203, 204, 207 and 208 of the try state gates 1301 and 1302, are turned Off all at once, so that each output of the try-state gates 1301 and 1302 becomes the high impedance, but a non-inverted output signal MT and an inverted output signal MB are turned to the High or Low level so as to hold the logical level of previous cycle of the non-inverted data signal DT, by a data holding function of the succeeding stage of the memory block DH1.

When the non-inverted clock signal CK is the Low level, the signal level at the output node S5 of the NOR gate 1303 is selectively turned to the High or Low level in response to the logical level of the non-inverted data signal DT, so that the signal levels at the output nodes S6 and S7 of the NOR gates 1304 and 1305, are selectively turned to the High or Low level. That is, when the non-inverted data signal DT is the Low level, the output node S5 of the NOR gate 1303 is turned to the High level as shown in FIG. 13B, so each output signal of the NOR gates 1304 and 1305 is turned to the Low level. Because of this, the normally-off type FETs 203 and 208 are turned On, and the normally-off type FETs 204 and 207 are turned Off in the try-state gates 1301 and 1302. As a result, the non-inverted output signal MT of the driving gate block DT1 is turned to the Low level and the inverted output signal MB is turned to the High level. On the other hand, the non-inverted data signal DT is the High level when the non-inverted clock signal CK is the Low level, the signal level at the output node S5 of the NOR gate 1303 is turned to the Low level, so that the signal levels at the output nodes S6 and S7 of the respective NOR gates 1304 and 1305 are turned to the High level. Because of this, the normally-off type FETs 203 and 208 are turned Off and the normally-off type FETs 204 and 207 are turned On in the try-state gates 1301 and 1302. As a result, the non-inverted output signal MT of the driving gate block DT1 is turned to the High level and the inverted output signal MB is turned to the Low level.

That is, in spite of the fact that the non-inverted data signal DT is only inputted to the driving gate block DT1 as input signal, the driving gate block DT1 can achieve the same function thereof shown in FIG. 3. In FIG. 13B, when the non-inverted data signal DT is the Low level, the signal levels at the output nodes S6 and S7 of the respective NOR gates 1304 and 1305 are temporarily turned to the High level at a time period from when the non-inverted clock signal CK is turned to the Low level up to when the signal level at the output node S5 of the NOR gate 1303 rises, generating a hazard. However, in the edge trigger type flip-flop circuit of the embodiment, because the succeeding stage slave latch 1111 is complimentarily operated depending on the inverted signal of the non-inverted clock signal CK or the inverted clock signal CKB, not causing such hazard and the like.

Figure 14:
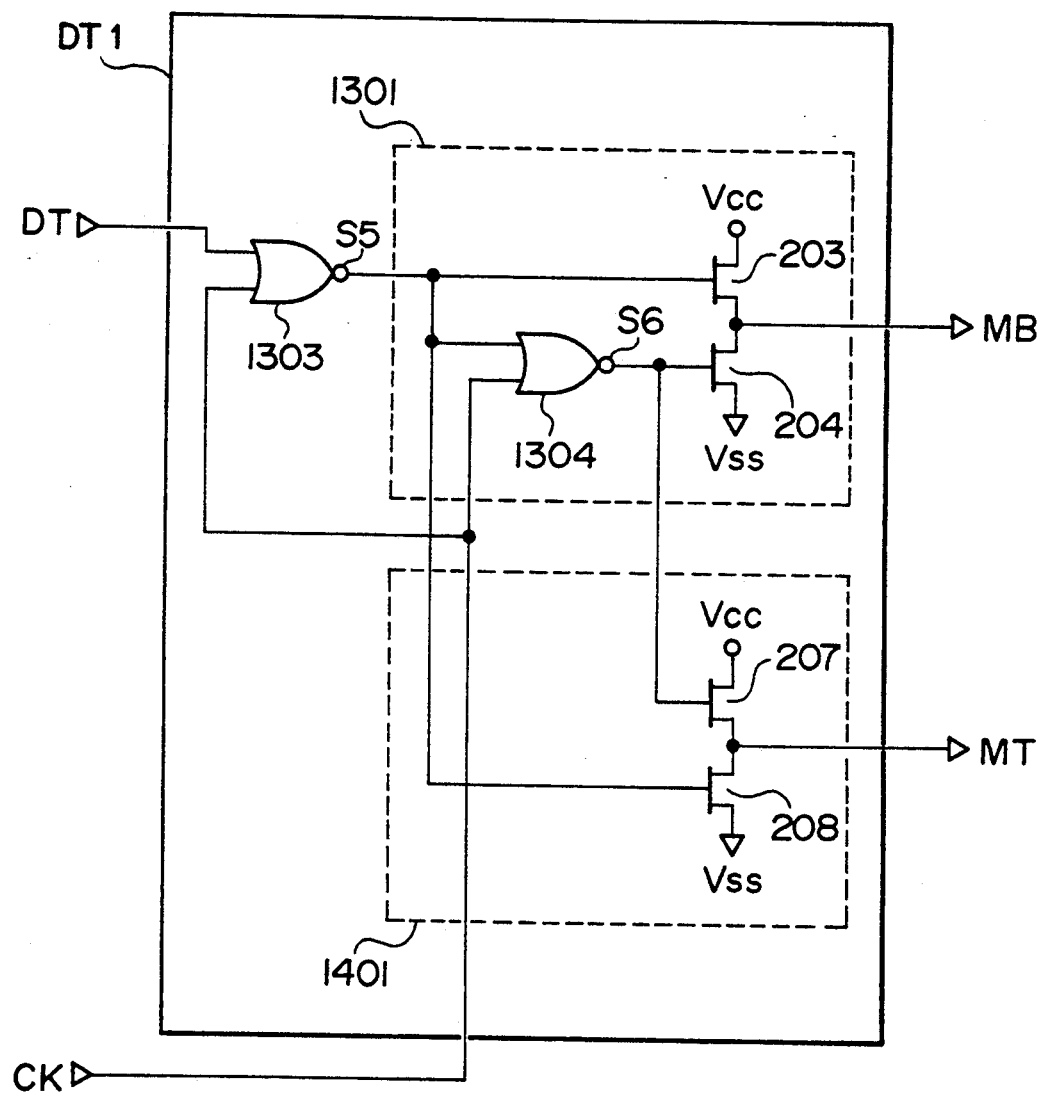
FIG. 14 is a circuit diagram showing still another driving gate block of the edge trigger type flip-flop circuit shown in FIG. 11A.

FIG. 14 shows an example of another driving gate block DT1 incorporated in the edge trigger type flip-flop circuit of the master latch 1110 as shown in FIG. 11A. The driving gate block DT1 in the embodiment is similar to the driving gate block DT1 shown FIG. 13A. NOR gates 1303, 1304 and normally-off type FETs 203, 204, 207 and 208 in FIG. 14, correspond to the NOR gates 1303, 1304 and the normally-off type FETs 203, 204, 207 and 208 shown in FIG. 13A, respectively.

In FIG. 14, a try-state gate 1401 in the driving gate block DT1 is equivalent to the try-state gate 1202 shown in FIG. 12. The try-state gate 1401 does not include a NOR gate corresponding to the NOR gate 1305 shown in FIG. 13A, but including a pair of the normally-off type FETs 207 and 208 connected to the positive source voltage (Vcc) and the negative source voltage (Vss) with totem pole shaped, in which a gate of the normally-off type FET 207 is connected to an output node S6 of the NOR gate 1304, and a gate of the normally-off type FET 208 is connected to an output node S5 of the NOR gate 1303. As is apparent from the description of FIG. 13A, the logical level of the output node S6 of the NOR gate 1304 is determined by the logical level similar to the output node S7 of the NOR gate 1305 shown in FIG. 13A. Because of this, the try-state gate 1401 serves as the same function as the try-state gate 1302 shown in FIG. 13A, enabling simplicity of the circuit construction as the driving gate block DT1. A try-state gate 1301 is similar to the try-state gate 1301 in FIG. 13A including operation, so the description is omitted for the sake of simplicity.

Figure 15A:
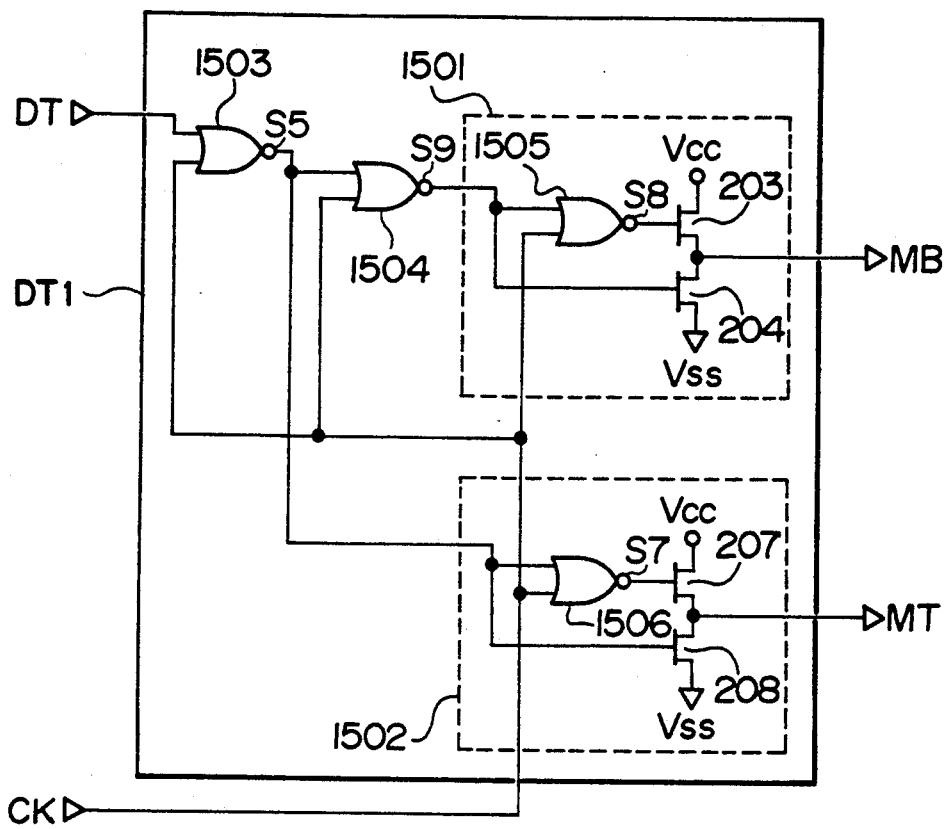
FIG. 15A is a circuit diagram showing still another driving gate block of the edge trigger type flip-flop circuit shown in FIG. 11A.

FIG. 15A shows an example of another driving gate block incorporated in the master latch 1110 of the edge trigger type flip-flop circuit shown in FIG. 11A. It is noted that the driving gate block DT1 is basically similar to the driving gate block DT1 shown in FIG. 13. NOR gates 1503, 1506 and the normally-off type FETs 203, 204, 207 and 208 shown in FIG. 15A, correspond to the NOR gates 1303, 1305 and the normally-off type FETs 203, 204, 207 and 208 shown in FIG. 13A.

In FIG. 15A, the try-state gate 1501 of the driving gate block DT1 is similar construction to the try-state gate 1302 shown in FIG. 13A. That is, the try-state gate 1501 includes the NOR gate 1505, an output node S8 of which is connected to a gate of the normally-off type FET 203. One input node of the NOR gate 1505 receives the output signal from an output node S9 of a NOR gate 1504, and the other input node thereof receiving a non-inverted clock signal CK. One input node of the NOR gate 1504 receives the output signal from the NOR gate 1503, and the other input node thereof receiving the non-inverted clock signal CK.

Figure 15B:
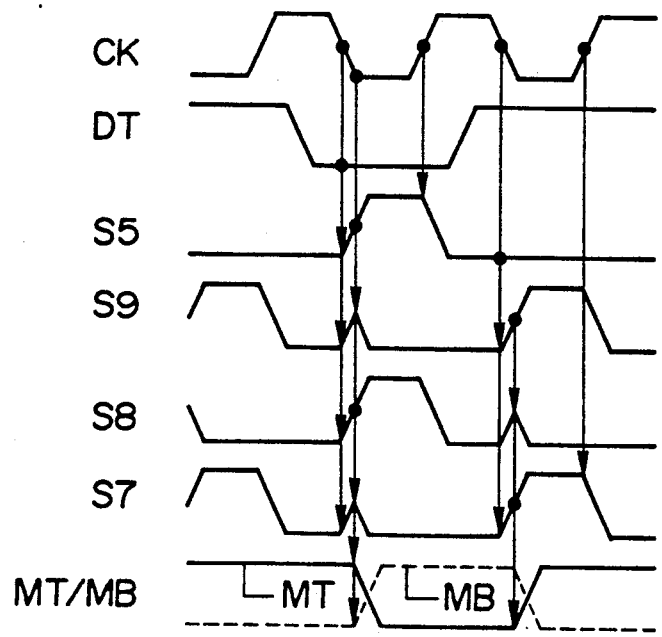
FIG. 15B is a time chart for the driving gate block shown in FIG. 15A.

Because of this, the signal level of the output node S9 of the NOR gate 1504 is selectively turned to the High level when the non-inverted clock signal CK is the Low level and the signal level of the output node S5 of the NOR gate 1503 is turned to the Low level, in other words, the non-inverted clock signal CK is the Low level and the non-inverted data signal DT is the High level, as shown in FIG. 15B. Also, the signal level of the output node S8 of the NOR gate 1505 is selectively turned to the High level when the non-inverted clock signal CK is the Low level and the signal level of the output node S9 of the NOR gate 1504 is turned to the Low level, in other words, the non-inverted clock signal CK is the Low level and the non-inverted data signal DT is the Low level. As a result, the driving gate block DT1 in the embodiment achieves the same function as the driving gate block DT1 in FIG. 3A, so a multi-input type edge trigger flip-flop circuit can be achieved. Also, because each gate of the normally-off type FETs 203, 204, 207 and 208 in the try-state gates 1501 and 1502 is connected to each output node of the NOR gates 1505, 1504, 1506 and 1503 in the embodiment, each signal level to the normally-off type FETs 203, 204, 207 and 208 can be independently set, enabling optimum operation. Furthermore, a hazard is generated at the output nodes S7 to S9 of the respective NOR gates 1506, 1505 and 1504 at the trailing edge of the non-inverted clock signal CK, however, actual harm does not occur as described above.

Figure 16A:
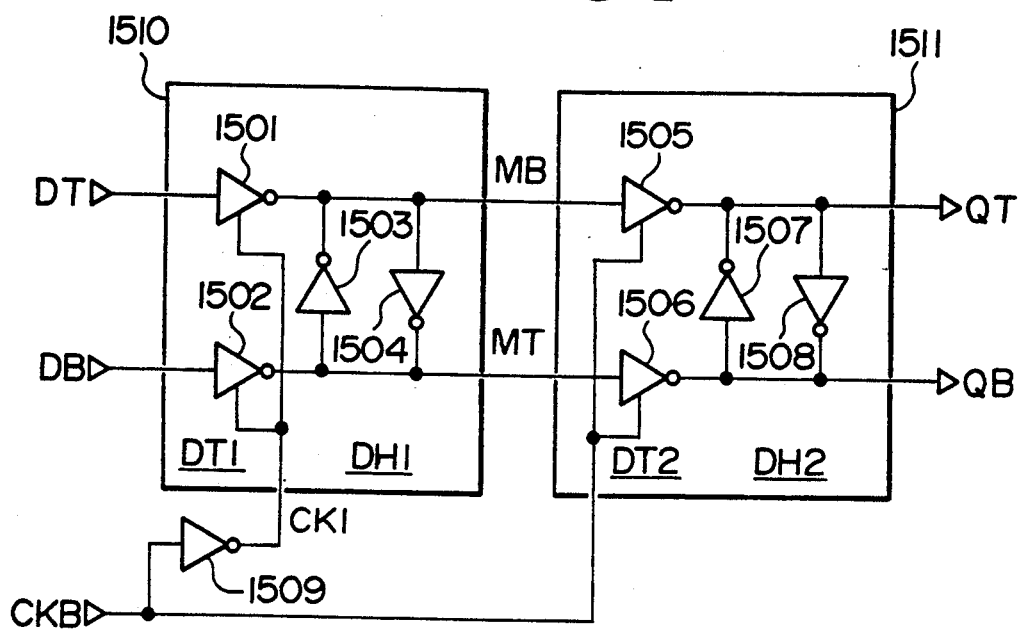
FIG. 16A is an edge trigger type flip-flop circuit of another embodiment.

FIG. 16A shows an example of another edge trigger type flip-flop circuit for use in the present invention. The edge trigger type flip-flop circuit is basically similar to that of FIG. 11A. Driving gate blocks DT1, DT2 and memory blocks DH1, DH2 shown in FIG. 16A, correspond to the driving gate blocks DT1, DT2 and the memory blocks DH1, DH2 shown in FIG. 11A, respectively.

Figure 16B:
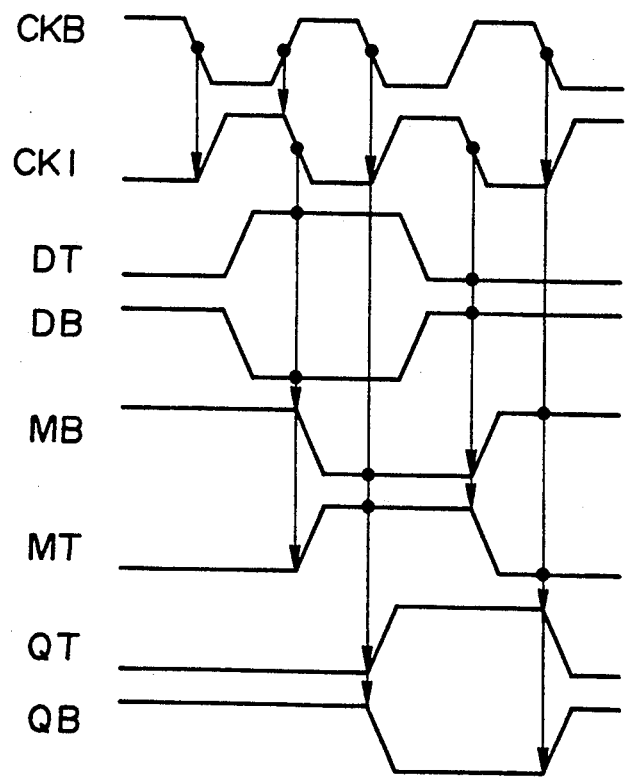
FIG. 16B is a time chart for the edge trigger type flip-flop circuit shown in FIG. 16A.

In FIG. 16A, a slave latch 1511 of the edge trigger type flip-flop circuit receives the inverted clock signal CKB similar to that of FIG. 11A, and a master latch 1510 thereof receives an inverted signal from an inverter 1509 by received the inverted clock signal CKB or a non-inverted clock signal CKI. The non-inverted clock signal CKI is a delay time caused by a transfer delay time of the inverter 1509 to which the inverted clock signal CKB is applied, as shown in FIG. 16B, and substantially corresponds to the non-inverted clock signal CK. Because of this, the edge trigger type flip-flop circuit in the embodiment has the same function and advantages as the edge trigger type flip-flop circuit shown in FIG. 11A, even though an input clock signal is only of the single inverted clock signal CKB. Also, a time period from the trailing edge of the inverted clock signal CKB up to when the logical level of the non-inverted output signal QT and the inverted output signal QB of the edge trigger type flip-flop circuit is reliably set, or the transfer delay time caused by the edge trigger type flip-flop circuit, is determined by only the transfer delay time caused by the single-stage try-state gate 1505 or 1506, similar to the edge trigger type flip-flop circuit shown in FIG. 11A. However, a time required for taking the non-inverted data signal DT in the edge trigger type flip-flop circuit or the set-up time of the edge trigger type flip-flop circuit, becomes a value substantially subtracted the transfer delay time caused by the inverter 1509 from the transfer delay time caused by the try-state gate 1501 or 1502, enhancing higher speed operation of the edge trigger type flip-flop circuit. Remainder f description is omitted because it is similar to FIG. 11A, which is already described.

Figure 17:
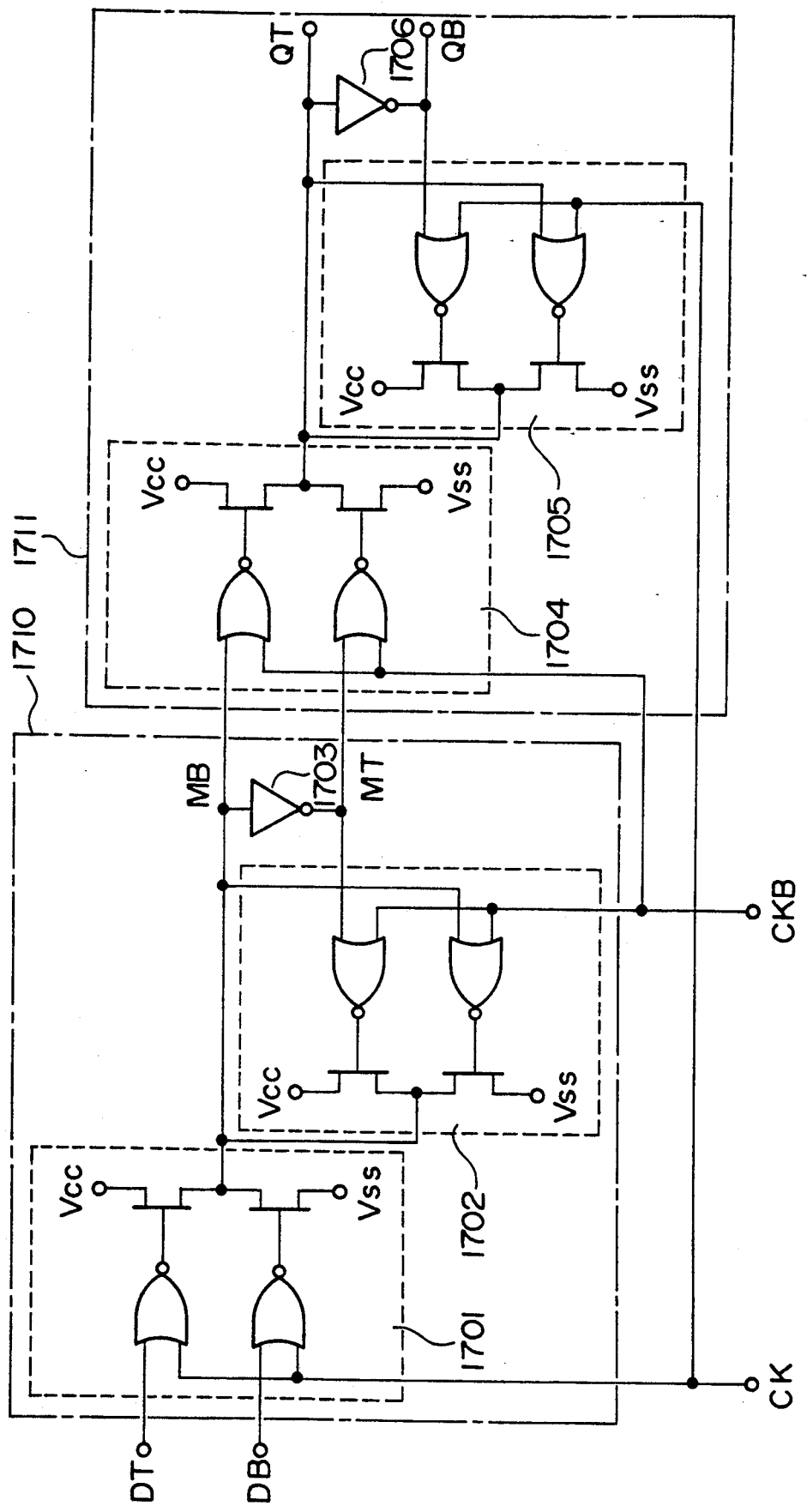
FIG. 17 is a circuit diagram showing an edge trigger type flip-flop circuit of still another embodiment.

FIG. 17 shows an example of another edge trigger type flip-flop circuit. The edge trigger type flip-flop circuit comprises two flip-flop circuits dependently connected one to the other. In FIG. 17, a master latch 1710 receives the data signals DT and DB as complementary signals, a try-state gate 1701 receives the non-inverted clock signal CK, and a try-state gate 1702 receives the inverted clock signal CKB, respectively. Also, a slave latch 1711 receives output signals MB and MT from the master latch 1710, a try-state gate 1704 receives the inverted clock signal CKB, and a try-state gate 1705 receives the non-inverted clock signal CK, respectively.

According to the above circuit construction, when the inverted clock signal CKB is the High level and the non-inverted clock signal CK is the Low level, the master latch 1710 outputs the output signal MB which is an inverted signal of the data signal DT in basis on a truth table of the try-state gate shown in FIG. 8B, so that an inverter 1703 outputs the output signal MT having the same phase as the data signal DT. At this time, the output of the slave latch 1711 which outputs the output signal QT is held in the output voltage of the try-state gate 1705 as the memory block, because the inverted clock signal CKB is the High level, thereby the output of the try-state gate 1704 becomes the high impedance.

When the inverted clock signal CKB is turned from the High to Low level, the non-inverted clock signal CK is turned from the Low to High level, the output of the try-state gate 1705 becomes the high impedance, then the try-state gate 1704 outputs the inverted output signal MB depending on the signal levels of output signals MB and MT from the master latch 1710. At this time, the output signals MB and MT of the master latch 1710 are held by the try-state gate 1702 as the memory block, because the non-inverted clock signal CK is turned from the Low to High level, the output of the try-state gate 1701 becomes the high impedance. Thereafter, even though the data signals DT and DB of the master latch 1710 are changed, the output signals MB and MT of the master latch 1710 are unaffected by such changes, so that the output signals QB and QT of the slave latch 1711 are also unaffected thereby. That is, the edge trigger type flip-flop circuit latches the data signals DT and DB at the trailing edge of changing the High to Low level of the inverted clock signal CKB.

As a result, a transfer delay time from when switching the inverted clock signal CKB up to when the output signal QT of the flip-flop circuit, becomes a delay time caused by the single-stage try-state gate In addition, a set-up time or a confirmed time required for inputting data up to when switching the inverted clock signal CKB, also becomes the delay time caused by the single-stage try-state gate. Accordingly, the edge trigger type flip-flop circuit can be reduced the number of devices and sizes thereof and maintained high speed operation, similar to the flip-flop circuit shown in FIG. 11A.

Figure 18:
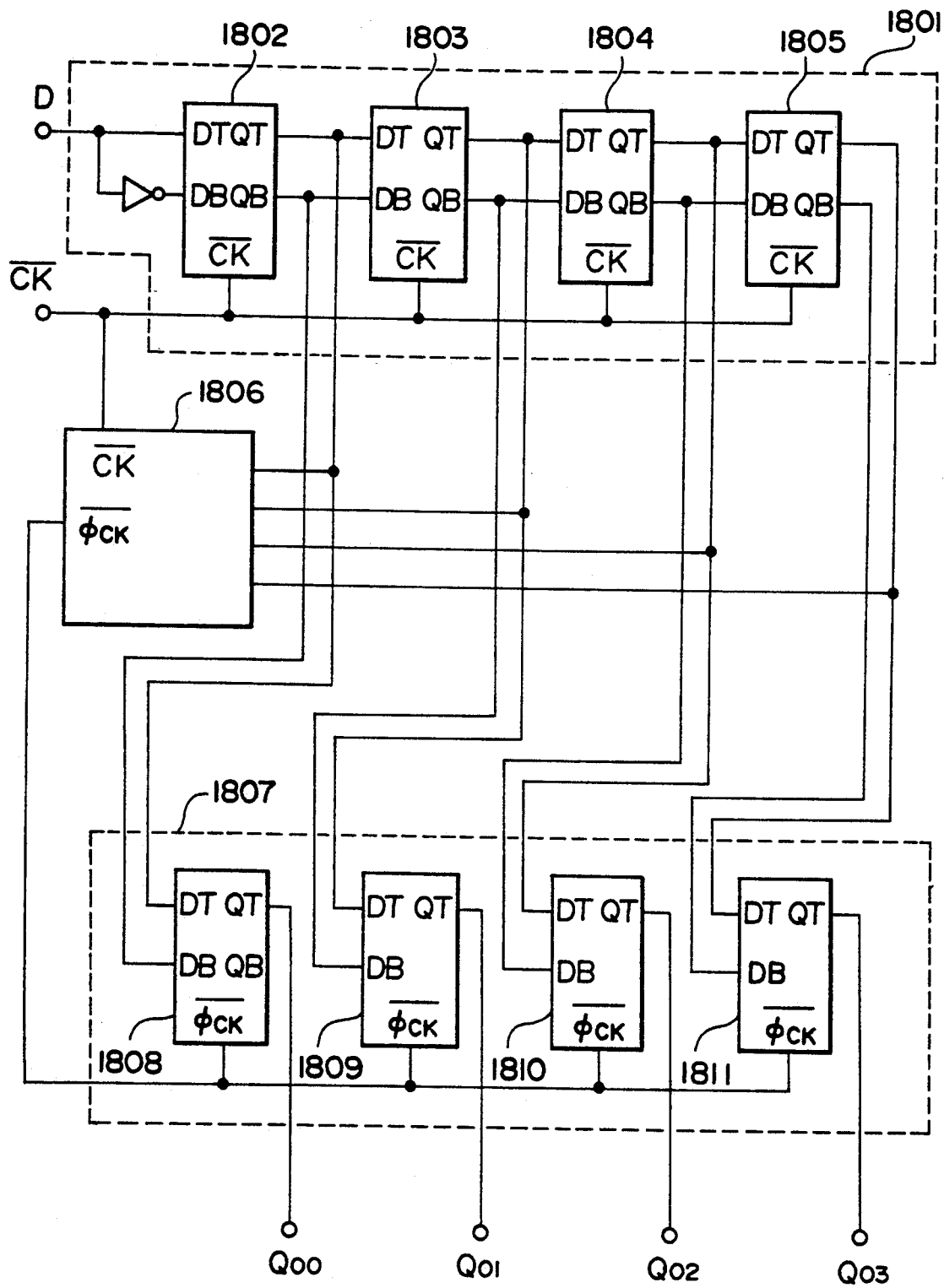
FIG. 18 is a circuit diagram showing a serial-parallel conversion apparatus using with the flip-flop circuit as an application.

FIG. 18 shows a conversion apparatus for converting a serial signal into a 4-bit parallel signal, as an application of the flip-flop circuit of the present invention. The conversion apparatus is generally applicable for a receiving device for use in high speed digital signal transmission system, and is used for converting a high speed and high density serial signal into a parallel signal.

In FIG. 18, a shift register unit 1801 comprises four flip-flop circuits 1802, 1803, 1804 and 1805 connected serially. A timing extraction unit 1806 outputs a 4-cycle signal $\overline{\Phi ck}$ with respect to one cycle of a clock signal CK at a time when 4-bit output signals of the shift register 1801 become a predetermined pattern. An output latch unit 1807 comprises four flip-flop circuits 1808, 1809, 1810 and 1811, these of which output 4-bit parallel signals received from the flip-flop circuits 1802, 1803, 1804 and 1805, respectively. A data signal D is of a serial signal supplied to the shift register unit 1801. A clock signal $\overline{CK}$ is synchronized with the data signal D. Output signals $Q_{o0}$, $Q_{o1}$, $Q_{o2}$ and $Q_{o3}$ are 4-bit parallel output signals outputted from the output latch unit 1807. It is noted that, for example, the flip-flop circuit shown in FIG. 1A is used in the embodiment shown in FIG. 18.

Figure 19:
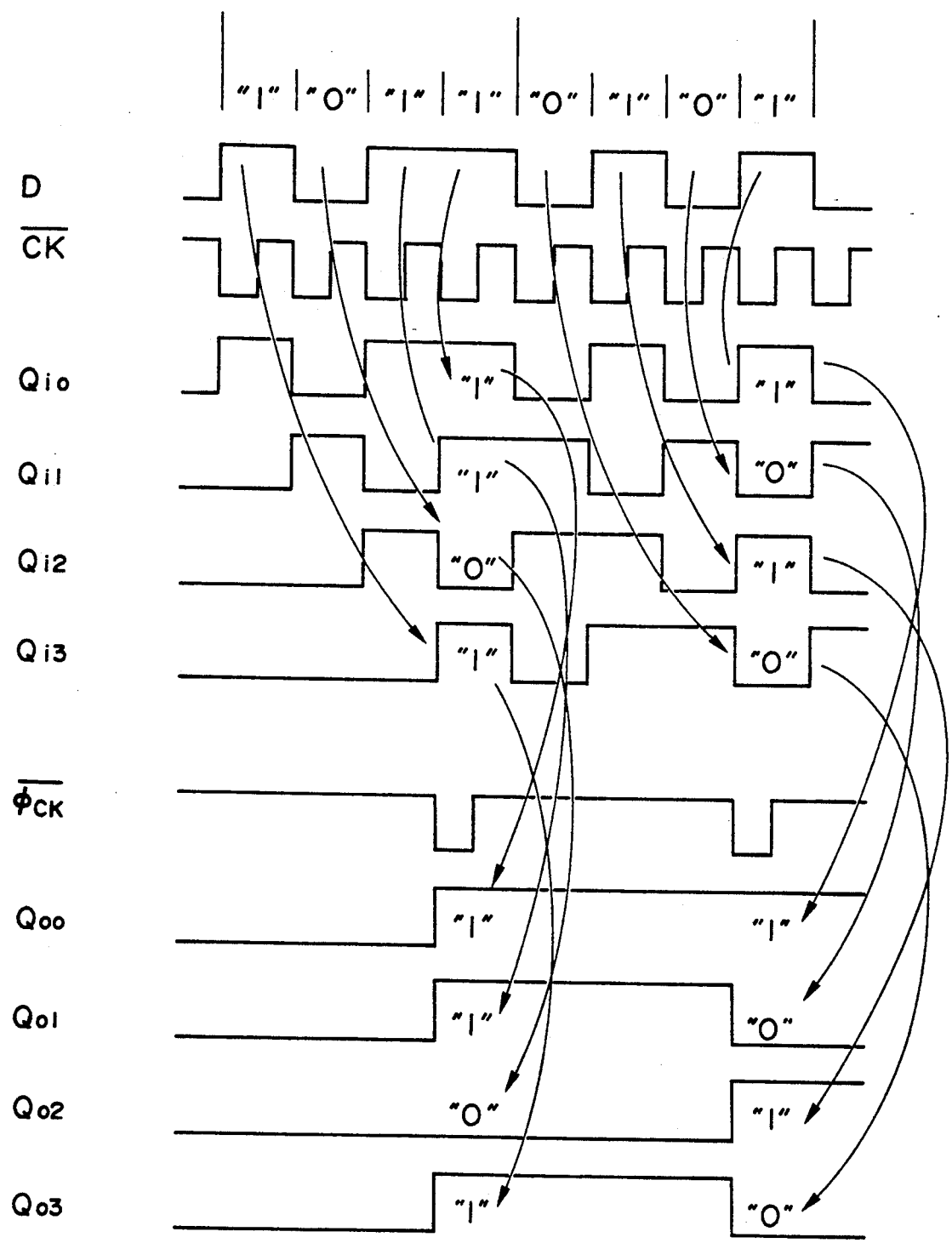
FIG. 19 is a time chart for the serial-parallel conversion apparatus shown in FIG. 18.
Figure 20:
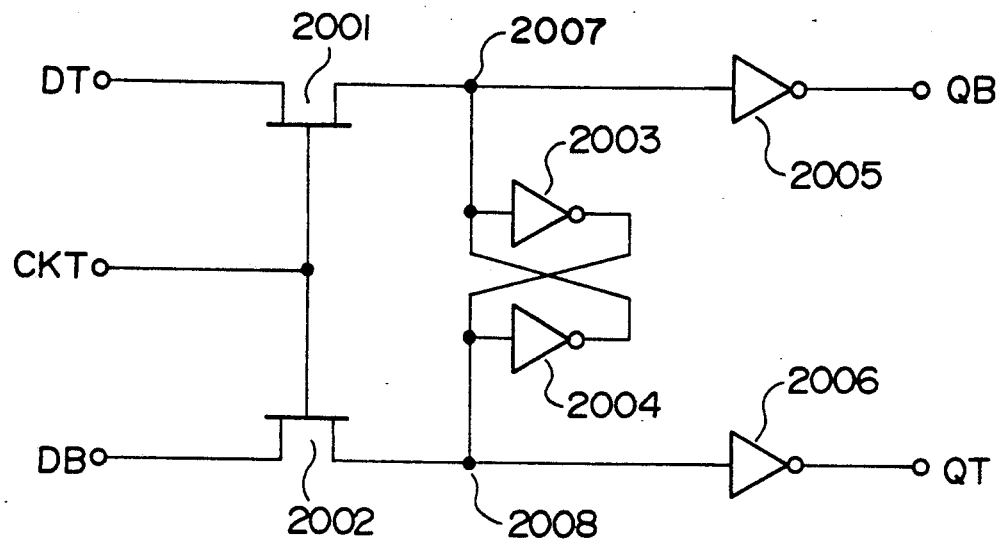
FIG. 20 is a circuit diagram showing a conventional flip-flop circuit.
Figure 21:
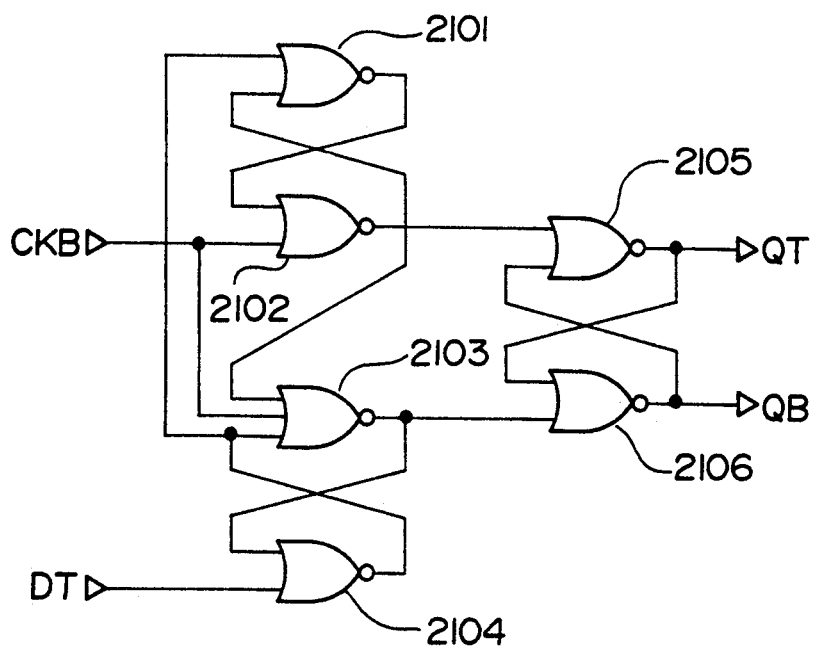
FIG. 21 is a circuit diagram showing a conventional edge trigger type flip-flop circuit.

FIG. 19 shows a time chart of the conversion apparatus shown in FIG. 18. In FIG. 19, the serial data signal D is always held in corresponding cycles of the clock signal $\overline{CK}$ by the flip-flop circuits 1802, 1803, 1804 and 1805 of the shift register unit 1801. Also, output signals QT and QB of respective flip-flop circuits 1802, 1803, 1804 and 1805 are supplied to the flip-flop circuits 1808, 1809, 1810 and 1811 of the output latch unit 1807 during a time period of the 4-cycle signal $\overline{\Phi ck}$ with respect to the clock signal CK. As a result, the output signals QT and QB equivalent to the data signal D during 4-cycle of the clock signal $\overline{CK}$ are parallelly outputted from the output latch unit 1807 by the time of the 4-cycle signal $\overline{\Phi ck}$.

In such type of conversion apparatus, in order to handle high frequency input data, the flip-flop circuit capable of operating in high speed is required for use in the shift register to take the input data therein. In case of the present invention, the conversion apparatus for converting serial data into parallel employs the high speed flip-flop circuits shown in FIG. 1A for use in the shift register unit and the output latch unit, so that the apparatus can handle high frequency input data.

The conversion apparatus employs the flip-flop circuit shown in FIG. 1A in the embodiment, but the flip-flop circuits described in the other embodiment and the edge trigger type flip-flop circuit, can also be employed for the conversion apparatus to obtain the same advantages described above.

The flip-flop circuit of the present invention can be applicable for not only the conversion apparatus described above, but also many type of data processing systems required high speed operation. The flip-flop circuit of the present invention can be comprised of small number of devices or elements in comparison with conventional circuit thereof, so that it is desirable to produce a large integrated circuit comprised of GaAs, particularly required for high speed operation.

According to the described above, the delay time from when switching the clock signal up to when switching the output signal, can be shortened, achieving the flip-flop circuit capable of operating in high speed.

What is claimed is:

1. A flip-flop circuit comprising:
    driving gate means for receiving a pair of complementary data signals and outputting a single phase data signal indicative of said complementary data signals; and
    memory means, connected to a first output node of said driving gate means, for holding the output signal of said driving gate means and outputting a pair of complementary signals indicative of said pair of complementary data signals, respectively,
    wherein said driving gate means includes a first tri-state gate having inputs for receiving said pair of complementary data signals and responding thereto, in response to a clock signal, for providing said single phase data signal to said first output node, and
    wherein said first tri-state gate comprises:
        a first NOR gate for receiving at a first input thereof a first one of said pair of complementary data signals and at a second input thereof said clock signal,
        a second NOR gate for receiving at a first input thereof the second one of said pair of complementary data signals and at a second input thereof said clock signal,
        a first normally-off type FET, a gate of which is connected to an output of said first NOR gate and a drain of which is connected to a first power source terminal, and
        a second normally-off type FET, a gate of which is connected to an output of said second NOR gate, a drain of which is commonly connected with a source of said first normally-off type FET to said first output node of said driving gate means and a source of which is connected to a second power source terminal.

2. A flip-flop circuit according to claim 1, wherein said driving gate means further includes a second tri-state gate having inputs for receiving said pair of complementary data signals and, responsive to said clock signal, for providing at a second output node of said driving gate means, connected with said memory means, a complementary signal to that provided-by said first tri-state gate; and which said second tri-state gate includes:
- a third NOR gate for receiving at a first input thereof the second one of said pair of complementary data signals and at a second input thereof said clock signal,
- a fourth NOR gate for receiving at a first input thereof the first one of said pair of complementary data signals and at a second input thereof said clock signal,
- a third normally-off type FET, a gate of which is connected to an output of the third NOR gate and a drain of which is connected to said first power source terminal, and
- a fourth normally-off type FET, a gate of which is connected to an output of said fourth NOR gate, a drain of which is commonly connected with a source of said third normally-off type FET to said second output node of said driving gate means and a source of which is connected to said second power source terminal.

3. A flip-flop circuit according to claim 2, wherein said memory means includes a pair of cross-coupled inverters, a first one of said pair of inverters has an input and output connected between said second output node and said first output node of said gate driving means, respectively, and the second of said pair of inverters has an input and output connected between said first output node and said second output node of said gate driving means, respectively.

4. A flip-flop circuit according to claim 3, wherein said first and second power source terminals correspond to positive and negative power source terminals, respectively.

5. A flip-flop circuit according to claim 3, wherein each inverter of said pair of cross-coupled inverters is a non-clocked inverter.

6. A flip-flop circuit according to claim 2, wherein each of the respective first and third NOR gates includes:
- a fifth normally-off type FET, a gate of which receives the first or second one of said pair of complementary data signals, a source of which is connected to said second power source terminal, and a drain of which is connected to the output of said first or third NOR gate;
- a sixth normally-off type FET, a gate of which receives said clock signal, a source of which is connected to said second power source terminal, and a drain of which is commonly connected to the drain of said fifth normally-off type FET and the output of said first or third NOR gate;
- a first normally-on type FET, a drain of which is connected to said first power source terminal and a source of which is connected to the output of said first or third NOR gate; and wherein each of the respective second and fourth NOR gates includes:
- a seventh normally-off type FET, a gate of which receives the second or first one of said pair of complementary data signals, a source of which is connected to said second power source terminal, and a drain of which is connected to the output of said second or fourth NOR gate;
- an eighth normally-off type FET, a gate of which receives said clock signal, a source of which is connected to said second power source terminal, and a drain of which is commonly connected to the drain of said seventh normally-off type FET and the output of said second or fourth NOR gate; and
- a second normally-on type FET, a drain of which is connected to said first power source terminal, and a source of which is connected to the output of said second or fourth NOR gate.

7. A flip-flop circuit according to claim 6, wherein the gate of said first normally-on type FET is coupled to receive a fixed voltage source.

8. A flip-flop circuit according to claim 7, wherein each of said first and third NOR gates includes a clamp circuit connected between the output of the respective one of said first and third NOR gates and said second power source terminal.

9. A flip-flop circuit according to claim 8, wherein said clamp circuit includes a normally-off type FET, a drain of which is connected to the output of said first or third NOR gate, a source of which is connected to said second power source terminal, and a gate of which is connected to an output of said first or second tri-state gate and which output corresponds to one of said first and second output nodes of said driving gate means, respectively.

10. A flip-flop circuit according to claim 9, wherein said first and second power source terminals correspond to positive and negative power source terminals, respectively.

11. A flip-flop circuit according to claim 1, wherein said memory means includes an inverter having an input coupled to said first output node to receive the single phase data output signal of said driving gate means and in response thereto outputting an inverter signal thereof, a second tri-state gate having inputs coupled to receive the inverted signal of said inverter and the output signal of said driving gate means, respectively, and having an output coupled to said first output node, whereby holding of the output signal of said driving gate means is effected in response to a control provided by said clock signal and a phase complement clock signal thereof.

12. A flip-flop circuit according to claim 11, wherein said second tri-state gate includes:
a third NOR gate for receiving at first and second inputs thereof the output signal of said inverter and said phase complement clock signal, respectively;
a fourth NOR gate for receiving at first and second inputs thereof the output signal of said driving gate means and said phase complement clock signal;
a third normally-off type FET, a gate of which is connected to an output of said third NOR gate and a drain of which is connected to said first power source terminal; and
a fourth normally-off type FET, a gate of which is connected to an output node of said fourth NOR gate, a drain of which is commonly connected with the source of said third normally-off type FET to said first output node of said driving gate means, and a source of which is connected to said second power source terminal.

13. A flip-flop circuit according to claim 12, wherein each of said first, second, third and fourth NOR gates includes:
a first normally-on type FET, a drain of which is connected to said first power source terminal and a source of which is connected to the output node of said first, second third or fourth NOR gate, respectively;
a fifth normally-off type FET, a gate of which is connected to one input node of said first, second, third or fourth NOR gate, a drain of which is connected to the source of said first normally-on type FET, and a source of which is connected to said second power source terminal, respectively; and
a sixth normally-off type FET, a gate of which is connected to another input node of said first, second, third and fourth NOR gate, a drain of which is connected to the source of said first normally-on type FET, and a source of which is connected to said second power source terminal, respectively.

14. A flip-flop circuit according to claim 13, wherein the gate of said first normally-on type FET is coupled to receive a predetermined fixed voltage source.

15. A flip-flop circuit according to claim 13, wherein each of said first and third NOR gates includes a clamp circuit connected between the outputs thereof and said second power source terminal, respectively.

16. A flip-flop circuit according to claim 15, wherein the clamp circuit includes a normally-off type FET, a drain of which is connected to the output of said first or third NOR gate, a source of which is connected to said second power source terminal, and a gate of which is connected to an output of said first or second tri-state gate.

17. A flip-flop circuit according to claim 16, wherein said first and second power source terminals correspond to positive and negative power source terminals, respectively.

18. A flip-flop circuit according to claim 1, wherein said first and second power source terminals correspond to positive and negative power source terminals, respectively.

19. A flip-flop circuit according to claim 18, wherein a voltage potential of about 1 volt is applied to said first power source terminal and 0 volt is applied to said second power source terminal.

20. A flip-flop circuit according to claim 1, further comprising
a second driving gate means coupled to receive the pair of complementary signals outputted from said memory means and providing a second single phase output signal at a second output node of a level indicative of said pair of complementary signals received from said memory means,
wherein said second driving gate means includes a second tri-state having inputs for receiving the pair of complementary signals from said memory means and outputting said second single phase signal in response to a phase complement of said clock signal; and
a second memory means, connected to said second output node of said second driving gate means holding a previously attained said second output signal at said second output node when said second tri-state gate is in a high impedance state and outputting a pair of complementary data signals.

21. A flip-flop circuit according to claim 20, wherein said first and second power source terminals correspond to positive and negative power source terminals, respectively.

22. A flip-flop circuit comprising:
driving gate means for receiving a pair of complementary data signals and outputting a single phase data signal indicative of said complementary data signals, wherein said driving gate means includes a first tri-state gate having inputs for receiving said pair of complementary data signals and responding thereto, in response to a clock signal, for providing said single phase data signal to said first output node;
memory means, connected to a first node of said driving gate means, for holding the output signal of said driving gate means and outputting a pair of complementary signals indicative of said pair of complementary data signals, respectively;
a second driving gate means coupled to receive the pair of complementary signals outputted from said memory means and providing a second single phase output signal at a second output node of a level indicative to the pair of complementary signals received from said memory means
wherein said second driving gate means includes a second tri-state gate having inputs for receiving the pair of complementary signals from said memory means and outputting said second single phase signal in response to a phase complement of said clock signal; and
a second memory means, connected to said second output node of said second driving gate means, holding a previously attained said second output signal at said second output node when said second tri-state is in a high impedance state and outputting a pair of complementary signals corresponding to said pair of complementary data signals.

23. A flip-flop circuit according to claim 22, wherein said first and second power source terminals correspond to positive and negative power source terminals, respectively.

24. A flip-flop circuit according to claim 20, wherein said phase complement signal of said clock signal is a delayed phase complement clock signal of said clock signal.

25. A flip-flop circuit comprising:
a pair of input terminals for inputting a pair of complementary signals;
first and second output terminals for outputting complementary signals corresponding to the pair of complementary input signals;
first, second, third and fourth NOR gates, each having first and second inputs and an output,
wherein the first of said first and fourth NOR gates are coupled to receive a clock signal and the second inputs of which are connected to one input terminal of said pair of input terminals, respectively, and
wherein the first inputs of said second and third NOR gates are coupled to receive said clock signal and the second inputs of which are connected to the other input terminal of said pair of input terminals;
a first FET, a gate of which is connected to an output node of the first NOR gate, a drain of which is connected to a first power source terminal, and a source of which is connected to said first output terminal;

a second FET, a gate of which is connected to an output node of said second NOR gate, a drain of which is connected to said first output terminal, and a source of which is connected to a second power source terminal;

a third FET, a gate of which is connected to an output node of said third NOR gate, a drain of which is connected to said first power source terminal, and a source of which is connected to said second output terminal;

a fourth FET, a gate of which is connected to an output node of said fourth NOR gate, a drain of which is connected to said second output terminal; and a pair of inverters, a first one of which has an input and output connected to said first and second output terminals, respectively, and the second one of which has an input and output connected to said second and first output terminals, respectively.

26. A flip-flop circuit according to claim 25, wherein said first and second power source terminals correspond to positive and negative power source terminals, respectively.

27. A flip-flop circuit according to claim 25, wherein a voltage potential of about 1 volt is applied to said first power source terminal and 0 volt is applied to said second power source terminal.

28. A flip-flop circuit according to claim 25, wherein each inverter of said pair of inverters is a non-clocked inverter.

29. A flip-flop circuit comprising:

a first tri-state gate having inputs for receiving a pair of complementary data signals and, in response to a first clock signal, providing a single phase output signal indicative of said complementary data signals;

an inverter having an input coupled to receive the output signal of said first tri-state gate and having an output for providing a phase complement signal of said output signal; and a second tri-state gate, an output node of which is connected to an output node of said first tri-state gate and inputs of which are coupled to receive the output signal of said first tri-state gate and the phase complement output signal from said inverter, for outputting a signal to hold an output voltage of said first tri-state gate in response to a second clock signal, complementary to said first clock signal.

30. A flip-flop circuit according to claim 29, wherein said second clock signal is a delayed phase complement clock signal of said first clock signal.

* * * * *